United States Patent
Ono et al.

(10) Patent No.: US 11,088,652 B2
(45) Date of Patent: Aug. 10, 2021

(54) ROTARY MACHINE DIAGNOSTIC SYSTEM

(71) Applicant: Hitachi, Ltd., Tokyo (JP)

(72) Inventors: Kazuo Ono, Tokyo (JP); Reiso Sasaki, Tokyo (JP); Takuma Nishimura, Tokyo (JP)

(73) Assignee: HITACHI, LTD., Tokyo (JP)

( * ) Notice: Subject to any disclaimer, the term of this patent is extended or adjusted under 35 U.S.C. 154(b) by 54 days.

(21) Appl. No.: 16/596,807

(22) Filed: Oct. 9, 2019

(65) Prior Publication Data
US 2020/0127594 A1 Apr. 23, 2020

(30) Foreign Application Priority Data

Oct. 22, 2018 (JP) .............................. JP2018-198117

(51) Int. Cl.
| | |
|---|---|
| *G01R 31/00* | (2006.01) |
| *H02P 29/50* | (2016.01) |
| *G01M 1/22* | (2006.01) |
| *G01R 19/25* | (2006.01) |
| *G01R 23/167* | (2006.01) |
| *G01R 19/00* | (2006.01) |
| *H02P 29/024* | (2016.01) |

(52) U.S. Cl.
CPC ............... *H02P 29/50* (2016.02); *G01M 1/22* (2013.01); *G01R 19/0007* (2013.01); *G01R 19/2513* (2013.01); *G01R 23/167* (2013.01); *G01R 31/005* (2013.01); *H02P 29/024* (2013.01)

(58) Field of Classification Search
None
See application file for complete search history.

(56) References Cited

U.S. PATENT DOCUMENTS

| | | | |
|---|---|---|---|
| 3,060,380 A | 10/1962 | Howells et al. | |
| 5,519,337 A * | 5/1996 | Casada ................ | G01R 31/343 324/545 |
| 6,172,509 B1 * | 1/2001 | Cash .................... | G01R 31/346 318/434 |
| 2005/0007096 A1 * | 1/2005 | Dimino .............. | G05B 23/0254 324/142 |
| 2011/0006756 A1 * | 1/2011 | Rosewell ............... | G01D 4/002 324/140 R |
| 2016/0124024 A1 * | 5/2016 | Jefferies ............... | G01R 15/183 324/127 |
| 2020/0033411 A1 * | 1/2020 | Tabuchi ................ | G01H 11/08 |

FOREIGN PATENT DOCUMENTS

| | | |
|---|---|---|
| JP | 2010-288352 A | 12/2010 |
| JP | 2013-106470 A | 5/2013 |
| JP | 2016-195524 A | 11/2016 |

OTHER PUBLICATIONS

Japanese Office Action received in corresponding Japanese Application No. 2018-198117 dated Apr. 27, 2021.

* cited by examiner

*Primary Examiner* — Jas A Sanghera
(74) *Attorney, Agent, or Firm* — Mattingly & Malur, PC

(57) ABSTRACT

A current detector and a detection unit are provided. The current detector is connected to at least one of drive current lines of a rotary machine. The detection unit performs an orthogonal detection on a main frequency detected by the current detector, and extracts a magnitude of a sideband wave. Then, a state of the rotary machine is diagnosed from the magnitude of the extracted sideband wave.

9 Claims, 22 Drawing Sheets

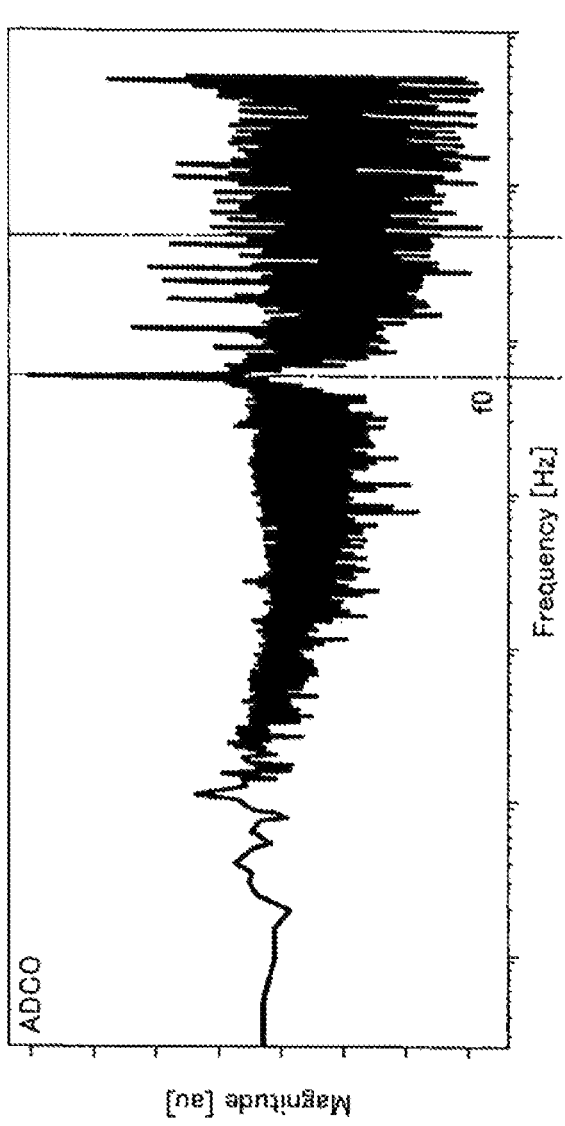
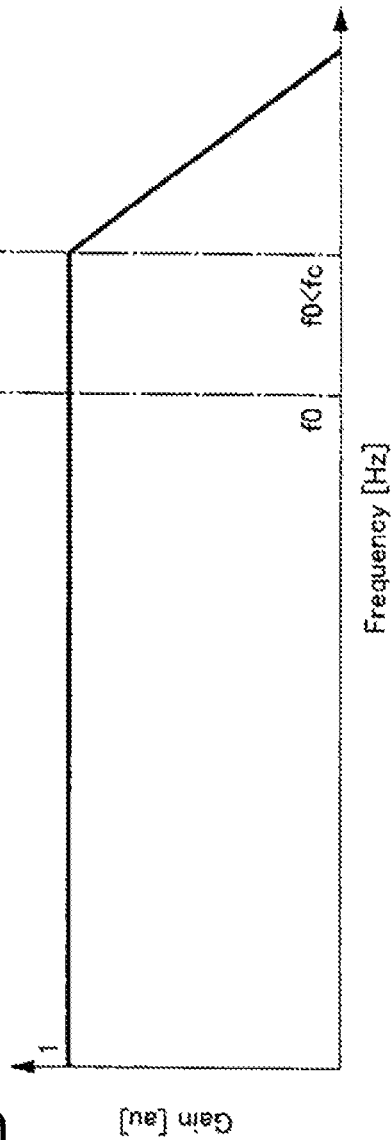
FIG. 6A
FIG. 6B

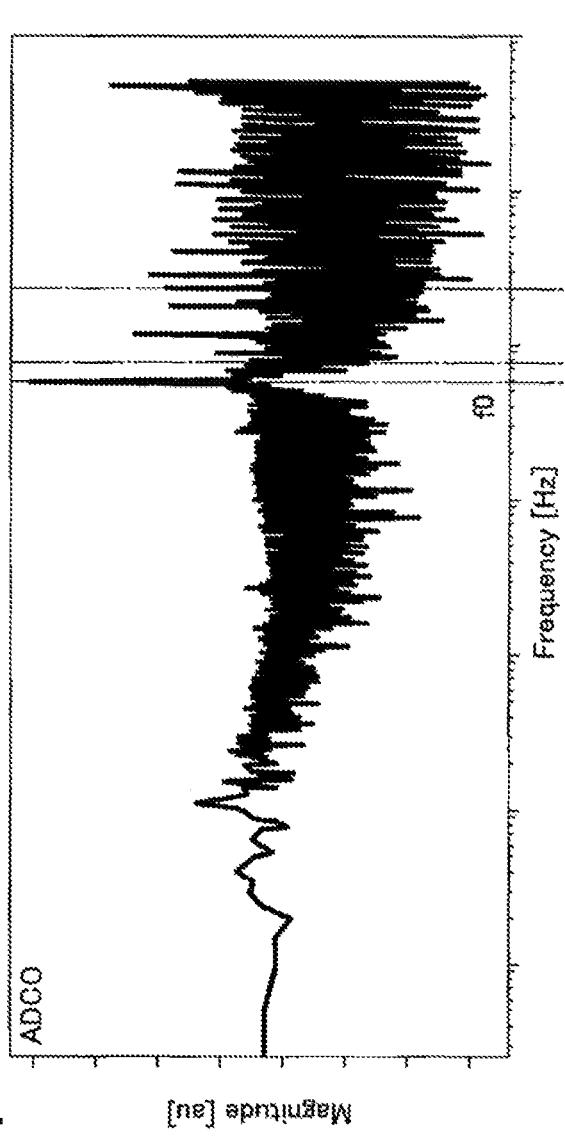
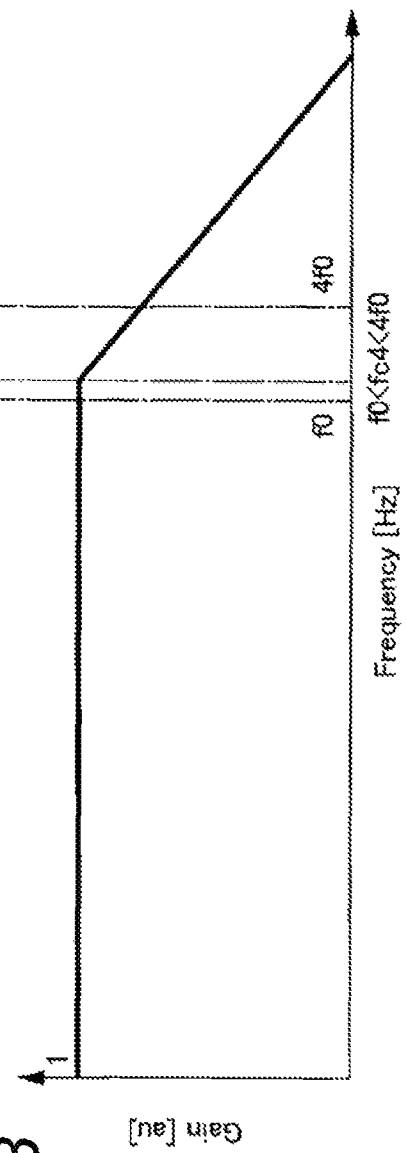
FIG. 19A
FIG. 19B

ROTARY MACHINE DIAGNOSTIC SYSTEM

CROSS-REFERENCE TO RELATED APPLICATION

The present application claims priority from Japanese application JP 2018-198117, filed on Oct. 22, 2018, the contents of which is hereby incorporated by reference into this application.

BACKGROUND OF THE INVENTION

1. Field of the Invention

The present invention relates to a rotary machine diagnostic system.

2. Description of the Related Art

Production lines using three-phase AC motors are utilized in various industries such as steel, machinery, and automobiles. For example, in a production line of steel, extended steel is conveyed on a conveyance line configured by tens or hundreds conveying motors, and is subjected to various procedures. In the motor (rotary machine) used in such a line, it has been known that the function as the rotary machine is stopped due to a damage on bearing mechanism or an insulating mechanism of wire.

In a case where a number of rotary machines are combined to realize a function such as conveying steel, a failure of some rotary machines may cause stopping the entire system. Therefore, there is need to perform inspection regularly of the whole rotary machines. However, such inspection of the whole rotary machines is not finished one day.

It takes a very long time of period to inspect the whole rotary machines at least once, and a rotary machine which is not yet inspected may cause a failure. Therefore, there is disclosed a technique to diagnose robustness of the rotary machine from a current waveform of the rotary machine (for example, see JP 2013-106470 A and JP 2016-195524 A).

SUMMARY OF THE INVENTION

As described above, the diagnosis of the rotary machine enables early detection of abnormality in the line so as to take measures. However, the diagnosis method known so far has problems as follows.

For example, in an abnormal diagnosis device of the rotary machine disclosed in JP 2013-106470 A, there is a need to change a movement by periodically applying a diagnosis signal to the rotary machine. Then, the controller of the rotary machine needs to be changed or improved. Therefore, a diagnosis facility is increased in size and in cost. In addition, there is a possibility to influence a production line because the diagnosis signal is actually applied to the rotary machine to modulate the movement of the rotary machine.

In addition, the diagnosis device of the electric motor drive disclosed in JP 2016-195524 A detects an operation current of the rotary machine, calculates a power spectrum from the current waveform by FFT (fast Fourier transformation), and detects a sideband wave appearing in the current waveform so as to detect an abnormality.

In other words, in the diagnosis device disclosed in JP 2016-195524 A, the configuration required for the diagnosis is a sensor for detecting a current and an analysis device. Therefore, the diagnosis can be made with a small-scaled facility compared to the diagnosis device disclosed in JP 2013-106470 A.

By the way, in the case of the diagnosis device disclosed in JP 2016-195524 A, the sideband wave is away from a main peak only by about 1 Hz, and a long period of time (exceeding 10 seconds) is required for the FFT calculation in order to analyze spectrums with accuracy. On the other hand, the frequency of the main peak is several tens to several hundred Hz, and thus the number of points of the FFT calculation is expanded. Therefore, a large capacity of memory is required and an extremely high calculation performance is required, so that it is necessary to provide a facility corresponding to a general computer device as an analysis device.

If an analysis device requiring such a large capacity of memory and the high calculation performance is provided in all (several tens to several hundreds) of the rotary machines to perform monitoring the rotary machines at once, the calculation amount and power consumption as a whole are increased too much.

In addition, in order to collect the expanded data obtained by the FFT calculation using a diagnostic system, a large capacity of data communication is required, and much power is consumed for the data communication. Therefore, power lines and communication lines are constructed in order to install the diagnostic system. Therefore, it is not easy to construct a system which monitors a large-scaled rotary machine.

On object of the invention is to provide a rotary machine diagnostic system which can accurately diagnose the rotary machine with a simple configuration.

In order to solve the above problem, the configurations disclosed in claims are employed for example.

The present application includes plural means to solve the above problems. As an example, there is provided a rotary machine diagnostic system which includes a current detector which detects a current of at least one current line connected to a rotary machine and a detection unit which extracts a magnitude of a sideband wave where an orthogonal detection is performed on a main frequency of the current detected by the current detector.

According to the invention, it is possible to simply provide a system monitoring a state such as degradation of the rotary machine at a low cost and with low power.

Objects, configurations, and effects besides the above description will be apparent through the explanation on the following embodiments.

BRIEF DESCRIPTION OF THE DRAWINGS

FIGS. 6A and 6B are waveform diagrams illustrating an example of a frequency characteristic of an input filter according to the first embodiment of the invention;

FIGS. 8A to 8C are waveform diagrams illustrating an example of the internal operation waveform of the detection unit according to the first embodiment of the invention, in which FIG. 8A illustrates a spectrum of an output GMIX of a mixer 1201, FIG. 8B illustrates a frequency characteristic of a low-pass filter 1204, and FIG. 8C illustrates a spectrum of an output GLPF1 of the low-pass filter 1204;

FIGS. 9A to 9C are waveform diagrams illustrating an example of the internal operation waveform of the detection unit according to the first embodiment of the invention, in which FIG. 9A illustrates a spectrum of an output GPID of a PID controller 1206, FIG. 9B illustrates a frequency characteristic of a band-pass filter 1208, and FIG. 9C illustrates a spectrum of an output GBPF of the band-pass filter 1208;

FIGS. 19A and 19B are waveform diagrams illustrating an example of the frequency characteristic of the input filter according to the second embodiment (modification) of the invention;

DESCRIPTION OF THE PREFERRED EMBODIMENTS

Figure 1:
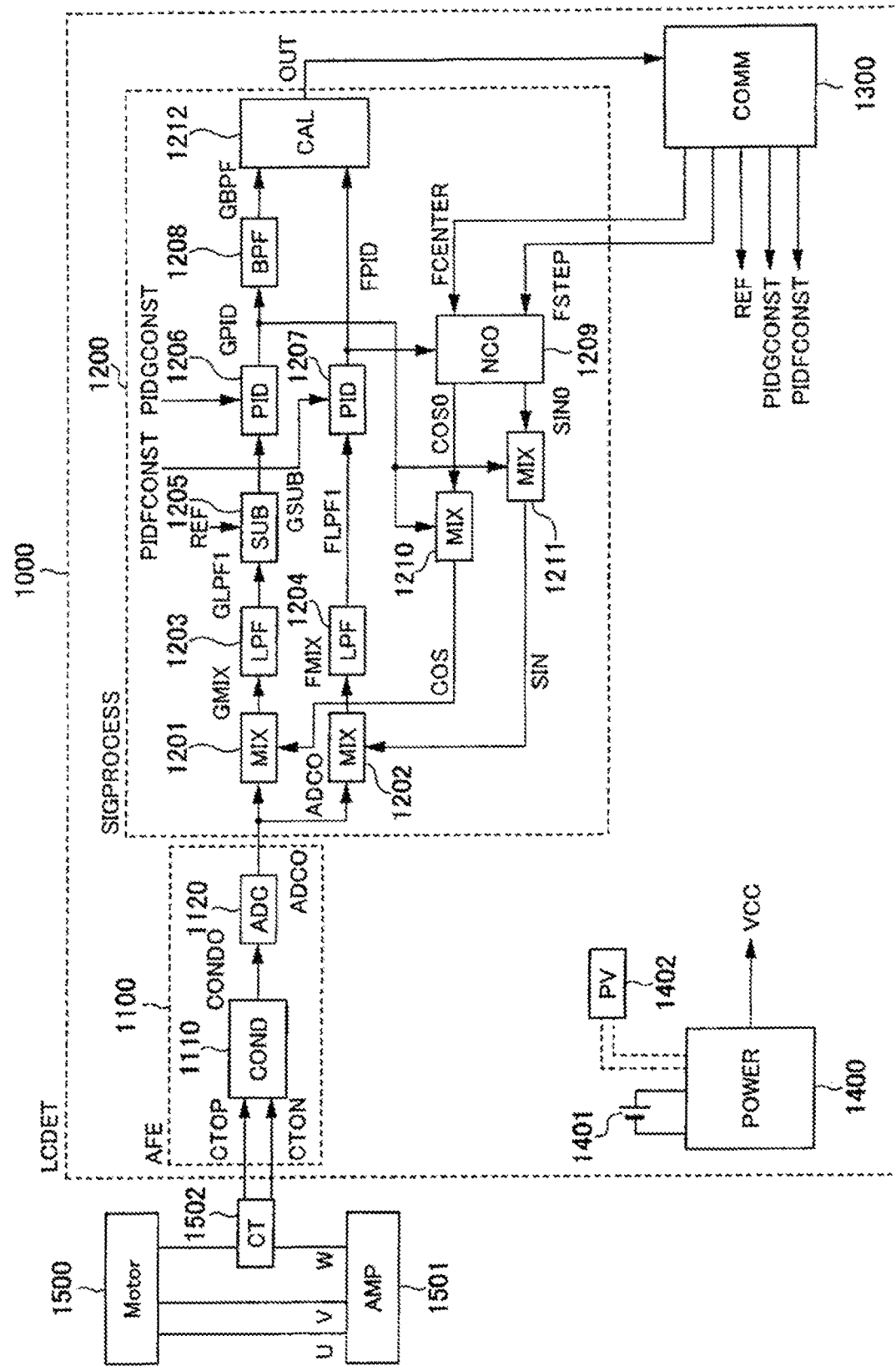
FIG. 1 is a block diagram illustrating an exemplary configuration of a detection unit of a first embodiment of the invention.

Hereinafter, embodiments of the invention will be described in detail with reference to the drawings. Further, the same members in the drawings for describing the embodiments will be attached with the same symbol as a principle, and the redundant description will be omitted.

The embodiments to be described below relate to a rotary machine diagnostic system which diagnoses a rotary machine installed in a production line of industries.

First Embodiment

First, a first embodiment of the invention will be described with reference to FIGS. 1 to 15.

FIG. 1 illustrates a configuration of a synchronization detection unit 1000 of the first embodiment.

Herein, a three-phase AC motor installed in a production line is assumed as a rotary machine 1500 of a diagnosis target. The rotary machine (three-phase AC motor) 1500 is connected to a servo amplifier 1501 through three power lines (u-phase, v-phase, and w-phase), and is driven by a three-phase AC power source which is supplied from the servo amplifier 1501.

Herein, a current detector (current transformer) 1502 is connected to at least one (herein, the w-phase power line as an example) of three power lines, and the current detector 1502 monitors the w-phase current. Further, the current detector 1502 is appropriately selected according to the capacity of current flowing in the rotary machine 1500. In other words, if a current detector having a small allowable current capacity is applied to a motor of a large current capacity, there is a need to be careful because the current detector may be damaged. Inversely, if a current detector having a large allowable current capacity is applied to a motor of a less current capacity, the current signal is not able to be detected.

A current detection signal obtained by the current detector 1502 is supplied to the orthogonal detection unit 1000.

The orthogonal detection unit 1000 is configured by the analog front end 1100, a digital signal processing unit 1200, a communication circuit 1300, and a power source circuit 1400.

Outputs CTOP and CTON of the current detector 1502 are input to the analog front end 1100. The analog front end 1100 includes an input circuit 1110 and an analog-digital conversion circuit 1120.

Figure 2:
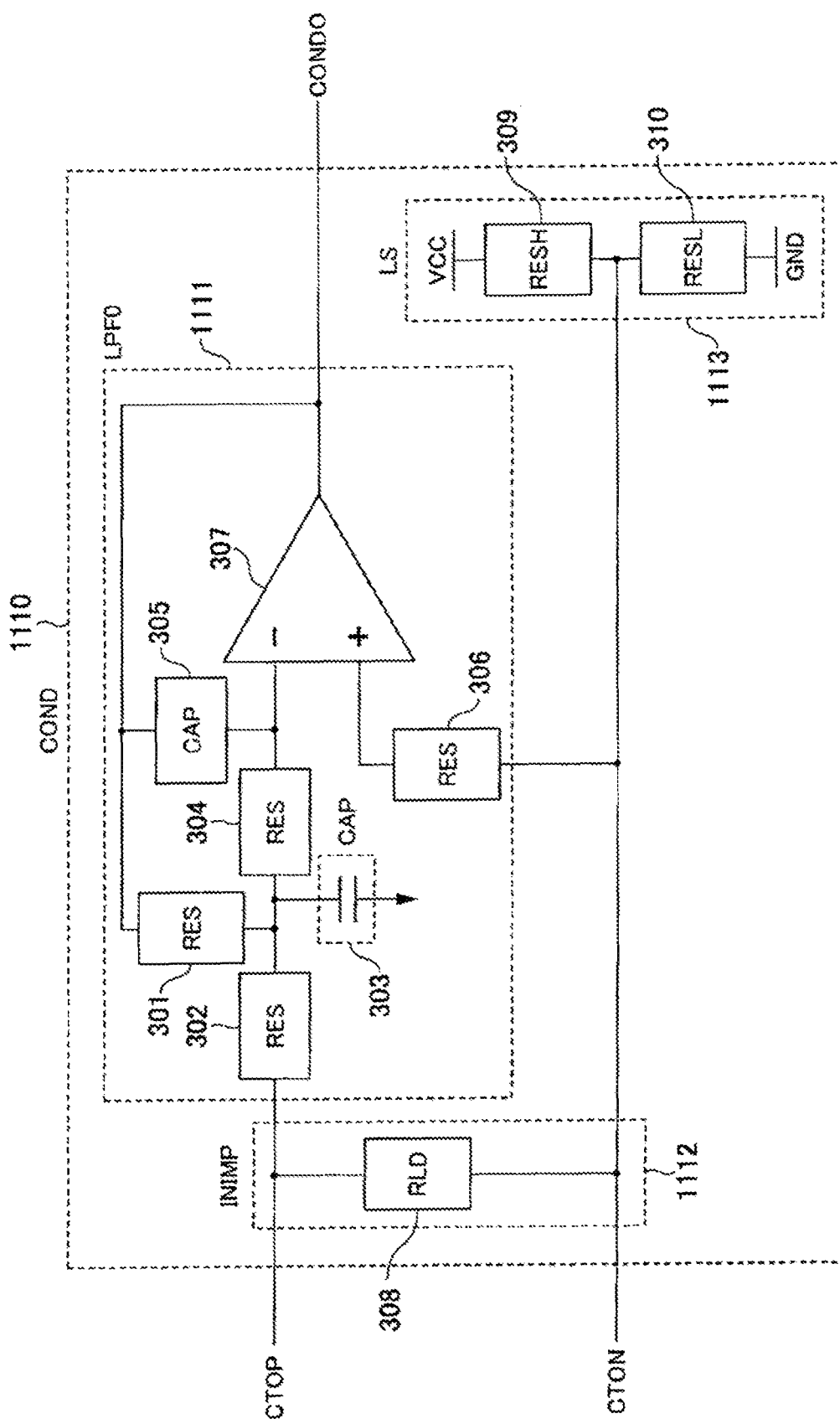
FIG. 2 is a circuit diagram illustrating an exemplary configuration of an input circuit of the first embodiment of the invention.

The input circuit 1110 performs a level conversion and an input filtering process to obtain an output CONDO. The output CONDO of the input circuit 1110 is supplied to the analog-digital conversion circuit 1120. An example of detailed configurations of the input circuit 1110 will be described below (FIG. 2).

The analog-digital conversion circuit 1120 digitizes an input analog signal to obtain an output ADCO. The output ADCO of the analog-digital conversion circuit 1120 is supplied to the digital signal processing unit 1200.

The digital signal processing unit 1200 includes a gain controlling mixer 1201, a frequency controlling mixer 1202, a gain controlling low-pass filter 1203, a frequency controlling low-pass filter 1204, and a target gain setting subtractor 1205. In addition, the digital signal processing unit 1200 includes a gain controller 1206, a frequency controller 1207, a band-pass filter 1208, a variable control oscillation circuit 1209, demodulation signal generating mixers 1210 and 1211, and an output calculation unit 1212.

Figure 3:
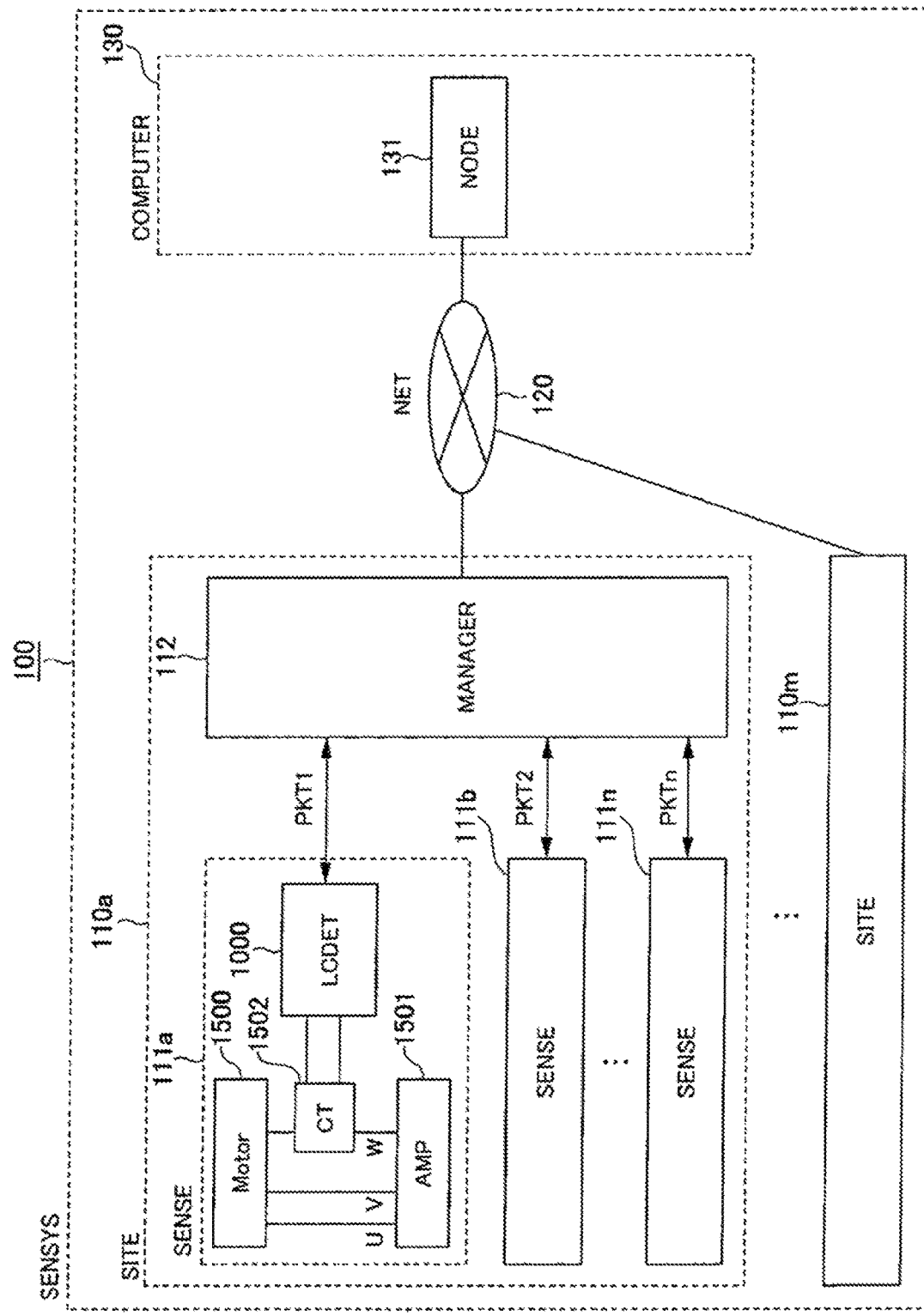
FIG. 3 is a block diagram illustrating an exemplary configuration of the entire system of the first embodiment of the invention.

Then, the digital signal processing unit 1200 receives a center frequency setting value FCENTER of a variable control oscillator 1209, a frequency gain FSTEP, a gain control coefficient PIDGCONST, a frequency control coefficient PIDFCONST, and a gain control target value REF which are received by the communication circuit 1300 from a host system (a cloud calculator 130: FIG. 3).

In addition, an output OUT of the digital signal processing unit 1200 is transmitted to the host system (the cloud calculator 130) illustrated in FIG. 3 through the communication circuit 1300.

Next, a gain control path of the digital signal processing unit 1200 of the orthogonal detection unit 1000 will be described.

In the gain controlling mixer 1201, the output ADCO of the analog-digital conversion circuit 1120 and an output COS of the demodulation signal generating mixer 1210 are multiplied. An output GMIX of the gain controlling mixer 1201 is supplied to the gain controlling low-pass filter 1203. Since a low band is passed by the gain controlling low-pass filter 1203, an integration gain in the controller at the later stage can be increased. A speed is not necessary in detecting a synchronization to a motor current, so that control with less errors can be achieved by effectively utilizing the integration control.

An output GLPF1 obtained by passing a low band in the gain controlling low-pass filter 1203 is supplied to the target gain setting subtractor 1205.

In the target gain setting subtractor 1205, a calculation (calculation of GLPF1−REF) of subtracting the gain control target value REF from the output GLPF1 is performed to obtain a calculation output GSUB. The calculation output GSUB of the target gain setting subtractor 1205 is supplied to the gain controller 1206. In the gain controller 1206, the gain control coefficient PIDGCONST is multiplied to the calculation output GSUB to obtain a gain control output GPID.

The gain control output GPID output by the gain controller 1206 is supplied to the band-pass filter 1208 to pass through a specific frequency band of the gain control output GPID. The output of the band-pass filter 1208 is supplied to the output calculation unit 1212.

Further, the gain control output GPID of the gain controller 1206 is also supplied to the demodulation signal generating mixers 1210 and 1211. In the demodulation signal generating mixer 1210, one output COS0 of the variable control oscillation circuit 1209 and the gain control output GPID are multiplied. The multiplication output COS is supplied to the gain controlling mixer 1201. In addition, in the demodulation signal generating mixer 1211, another output SIN0 of the variable control oscillation circuit 1209 and the gain control output GPID are multiplied. A multiplication output SIN is supplied to the frequency controlling mixer 1202.

Next, a frequency control path of the digital signal processing unit 1200 of the orthogonal detection unit 1000 will be described.

In the frequency controlling mixer 1202, the output ADCO of the analog-digital conversion circuit 1120 and the output SIN of the demodulation signal generating mixer 1211 are multiplied. The output FMIX of the frequency controlling mixer 1202 is supplied to the frequency controlling low-pass filter 1204.

An output FLPF1 obtained by passing through a low band in the frequency controlling low-pass filter 1204 is supplied to the frequency controller 1207. In the frequency controller 1207, the frequency control coefficient PIDFCONST is multiplied to the output FLPF1, the frequency control output FPID is obtained.

The frequency control output FPID output by the frequency controller 1207 is supplied to the output calculation unit 1212.

In addition, the frequency control output FPID output by the frequency controller 1207 is also supplied to the variable control oscillation circuit 1209. The variable control oscillation circuit 1209 generates the oscillation outputs COS0 and SIN0 on the basis of the frequency control output FPID and the frequency gain FSTEP and the center frequency setting value FCENTER obtained from the communication circuit 1300.

The output calculation unit 1212 appropriately processes a gain control output GBPF and the frequency control output FPID to generate the transmission signal OUT. For example, various types of filtering processes, code conversion for output, and CRC calculation may be considered. These processes may be provided flexibly according to a system configuration.

Further, as described below in the examples of FIGS. 11A and 11B, the output calculation unit 1212 may perform the fast Fourier transformation (FFT) operation to analyze frequencies. However, the FFT calculation performed by the output calculation unit 1212 is performed on the gain control output GBPF, and can be performed at a significantly low sampling rate compared to a case where the output of the current detector 1502 is directly calculated through the FFT calculation.

The transmission signal OUT obtained by the output calculation unit 1212 is transmitted to the host system (the cloud calculator 130) illustrated in FIG. 3 from the communication circuit 1300.

Further, in the power source circuit 1400 of the orthogonal detection unit 1000, for example, a battery 1401 is connected, and obtains a power source voltage VCC to operate circuits in the orthogonal detection unit 1000. The use of the battery 1401 is an example. The connection is illustrated with a broken line in FIG. 1. Likewise, an energy harvesting device such as a solar battery cell 1402 may be installed so that the power source circuit 1400 may obtain the power source voltage VCC. Further, the energy harvesting device may be used jointly with the battery 1401.

FIG. 2 illustrates an exemplary configuration of the input circuit 1110 of the analog front end 1100.

The input circuit 1110 includes a low-pass filter 1111, an input load 1112, and a level shifter 1113.

The input load 1112 is configured by a resistive load 308 to which two inputs CTOP and CTON of the current detector 1502 are connected. The size of the resistive load 308 needs to be designed depending on the applied current detector 1502.

The level shifter 1113 has a function of adjusting an input level with respect to the analog-digital conversion circuit 1120 which is connected to the later stage of the input circuit 1110. In other words, the level shifter 1113 divides a voltage between the power source voltage VCC and a ground potential GND using a high-side voltage dividing resistor 309 and a low-side voltage dividing resistor 310, and applies an appropriately adjusted level to one input CTON of the current detector 1502. Herein, the predetermined reference level needs to be designed in consideration of an influence even on the low-pass filter 1111.

The low-pass filter 1111 is an active amplifier which is configured by four resistors 301, 302, 304, and 306, two capacitors 303 and 305, and an operational amplifier 307. The active amplifier has a merit on adjusting a gain compared to a passive amplifier.

The output CONDO obtained by the low-pass filter 1111 is supplied to the analog-digital conversion circuit 1120 (FIG. 1).

FIG. 3 is a diagram illustrating an exemplary entire configuration of a rotary machine diagnostic system 100.

The rotary machine diagnostic system 100 includes a plurality of measurement sites 110a to 110m, a network 120, and the cloud calculator 130.

The measurement sites 110a to 110m are installed as many as the number of installed rotary machines 1500 of a production line. One measurement site 110a may be installed depending on a system configuration.

FIG. 3 illustrates the configuration of one measurement site 110a, but the other measurement sites 110b to 110m are also configured similarly.

The measurement sites 110a to 110m includes a plurality of rotary machine measurement units 111a to 111n to measure the rotary machine 1500 and a data collecting device 112 to collect packets PKT1, PKT2, . . . , and PKTn output by the rotary machine measurement units 111a to 111n. The rotary machine measurement units 111a to 111n are also installed as many as the number of the installed rotary machines 1500 of a production line. One rotary machine measurement unit 111a may be installed depending on a system configuration.

Each of the rotary machine measurement units 111a to 111n includes the current detector 1502 to monitor the current of the rotary machine 1500 and the orthogonal detection unit 1000 to detect the current detected by the current detector 1502.

The communication circuits 1300 (FIG. 1) of the orthogonal detection units 1000 of the rotary machine measurement units 111a to 111n output the packets PKT1, PKT2, . . . , and PKTn to which measurement data of the rotary machine is included.

The data collecting device 112 transfers the packets PKT1 to PKTn from the rotary machine measurement units 111a to 111n to the cloud calculator 130 through the network 120.

In the cloud calculator 130, the data containing the received packets PKT1 to PKTn is accumulated. Then, various processes are performed using the accumulated data at a calculation node 131 of the cloud calculator 130. The information of the calculation node 131 is referred from the system which monitors a production line using the rotary machine, and a process useful for the operation is performed in accordance with a deteriorated state of the rotary machine. With this configuration, it is expected that downtime of the machine is minimized, and contributes to a reduction of operation cost.

Figure 4:
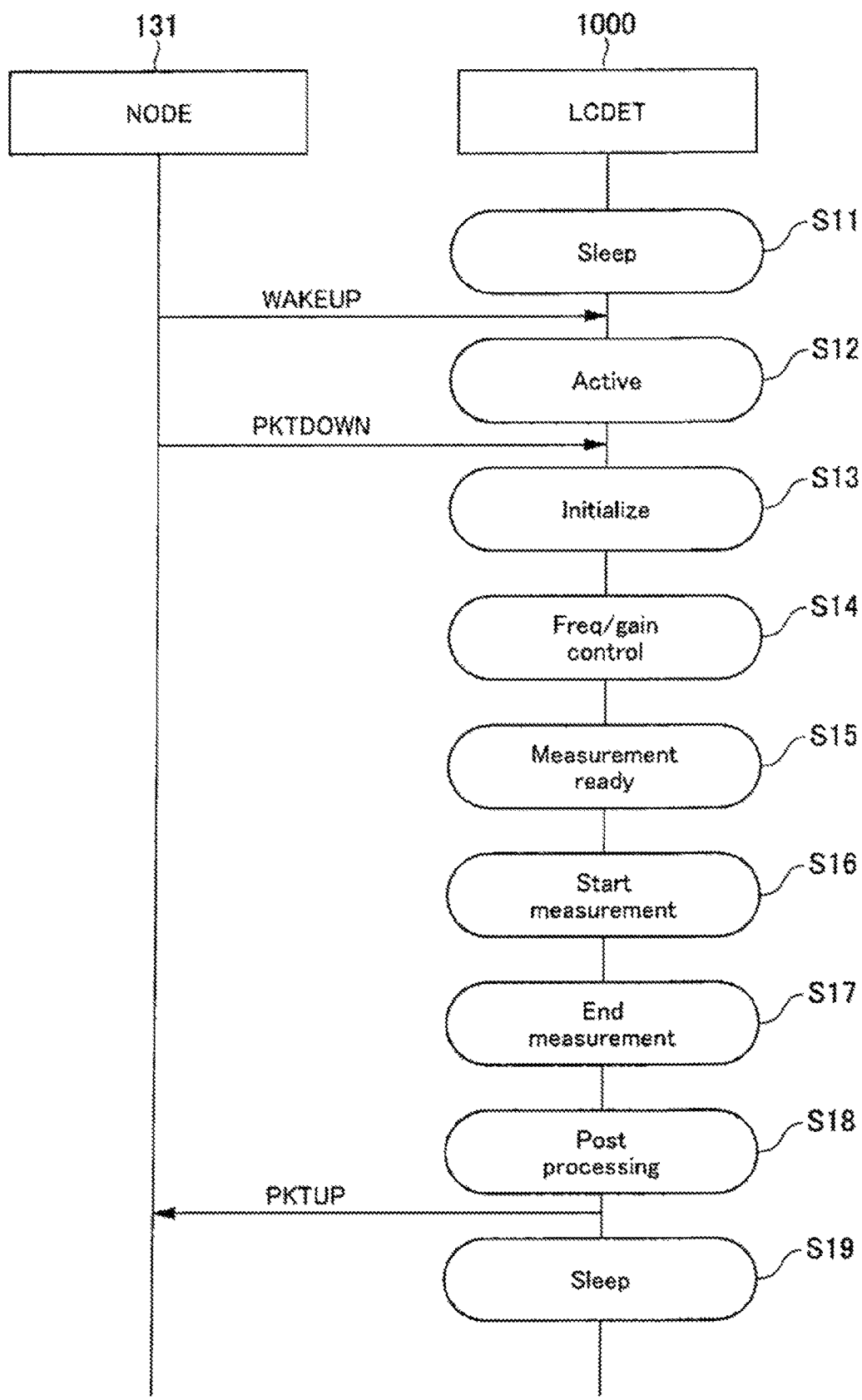
FIG. 4 is a sequence diagram at the time of activation of the detection unit according to the first embodiment of the invention.

FIG. 4 is an activation sequence in which the orthogonal detection unit 1000 of the specific measurement site 110a is activated by a command from the calculation node 131 of the cloud calculator 130.

At the time of the state before the calculation node 131 is activated, the orthogonal detection unit 1000 is in a sleep mode, and is on standby at a state where the measurement is not performed (Step S11). In this way, since the orthogonal detection unit 1000 is on standby at the sleep mode, so that it is possible to reduce power consumption of the rotary machine measurement unit 111a. Therefore, it is possible to extend a battery life when the terminals of the rotary machine measurement units 111a to 111n are driven by batteries. The operation cost of the rotary machine diagnostic system 100 can be reduced.

Herein, when an activation signal WAKEUP is transferred from the calculation node 131 to the measurement site 110a, the orthogonal detection unit 1000 of the corresponding measurement site 110a transitions to an active state (Step S12). Thereafter, a downlink communication PKTDOWN from the calculation node 131 is transmitted as needed, and a measurement condition is set. The setting of the measurement condition in the downlink communication PKTDOWN may be not performed every time. For example, a predetermined operation condition may be performed when the measurement site 110a is needed to be changed after being installed.

Then, the orthogonal detection unit 1000 of the measurement site 110a performs an initialization operation (Step S13), performs the frequency control and the gain control at a setting state (Step S14), enters preparation of a synchronization detecting operation (Step S15), and starts to measure with a synchronization detection (Step S16). Herein, for example, there is considered a method of creating a signal notifying that each control is statically determined, and utilizing the signal as a measurement start trigger signal. As a method of detecting that control is statically determined, there may be considered a method in which a difference between a control result and a control target is monitored to detect whether the monitored difference is less than a predetermined setting value.

Thereafter, the orthogonal detection unit 1000 of the measurement site 110a ends the measurement with the synchronization detection (Step S17). For example, the measurement ends when a time is measured using an inner timer after the measurement starts and a predetermined time elapses. A time for starting the measurement may also be set to a measurement setting value by a downlink communication. With this configuration, the operation cost can be reduced.

When the measurement ends, the communication circuit 1300 (FIG. 1) of the orthogonal detection unit 1000 transmits measurement result data by an uplink communication (Step S18). The calculation node 131 diagnoses a state of the rotary machine in a calculation process based on the received measurement result data.

Then, the orthogonal detection unit 1000 of the measurement site 110a enters a sleep state after the uplink data communication, and is on standby until the next WAKEUP signal is received (Step S19).

Next, the description will be given about an operation of measuring the state of the rotary machine by the detection of the orthogonal detection unit 1000 of this embodiment.

Figure 5:
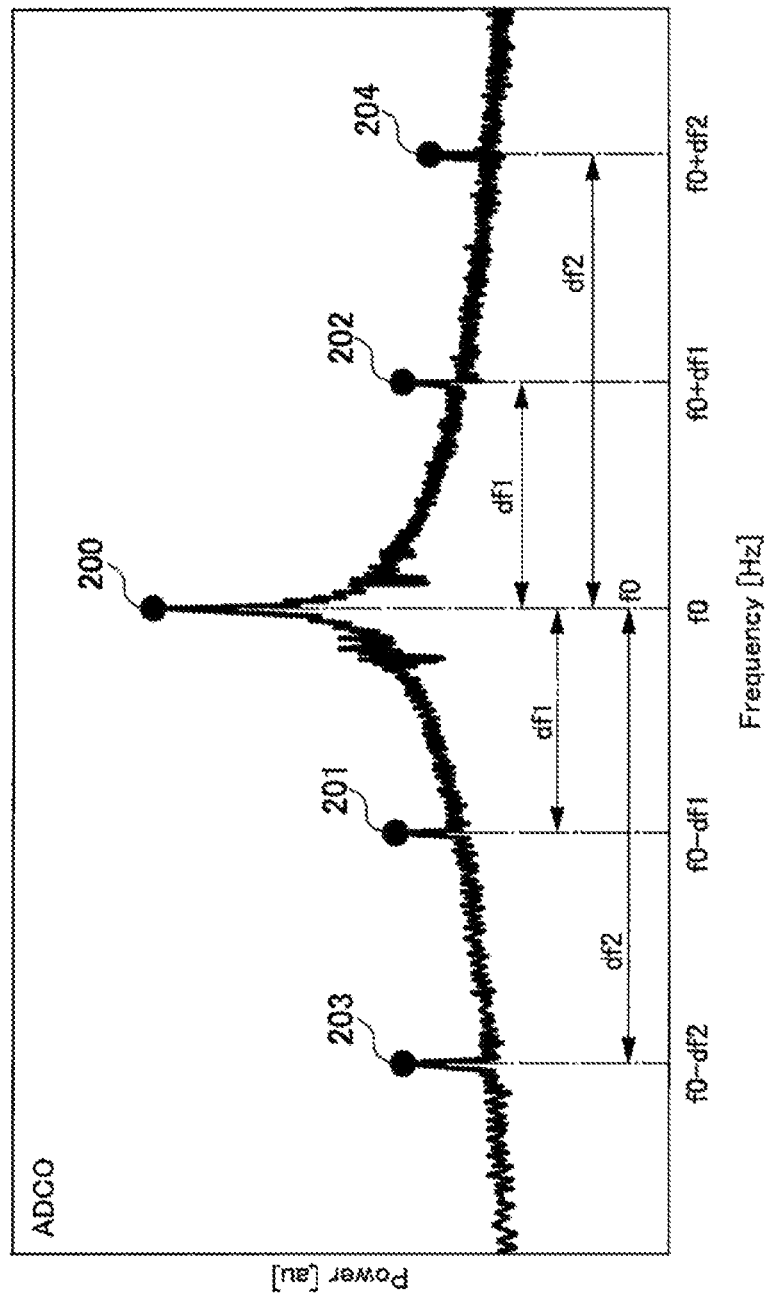
FIG. 5 is a waveform diagram illustrating an example of a current spectrum observed in the first embodiment of the invention.

FIG. 5 is an example of spectrum analysis of an input signal (the output signal of the current detector 1502) to the orthogonal detection unit 1000. The horizontal axis of FIG. 5 represents frequency, and the vertical axis represents power at each frequency.

A frequency position at the center of the waveform illustrated in FIG. 5 is a main peak 200. Then, first sideband waves 201 and 202 and second sideband waves 203 and 204 are generated about a frequency position f0 of the main peak. Herein, when the first sideband waves 201 and 202 and the second sideband waves 203 and 204 are abnormal, the rotary machine 1500 is informed that there is an abnormality such as degradation. The orthogonal detection unit 1000 measures the state of the rotary machine 1500 from the sideband waves 201, 202, 203, and 204.

A frequency difference between the frequency f0 of the main peak 200 and the first sideband waves 201 and 202 is df1. Similarly, a frequency difference between the frequency f0 of the main peak 200 and the second sideband waves 203 and 204 is df2.

In the orthogonal detection unit 1000, the main peak 200 is detected to convert the frequency f0 of the main peak 200 into a direct current and two times the harmonic wave 2f0. The first sideband waves 201 and 202 move to the frequency df1, and the second sideband waves 203 and 204 move to the frequency df2.

Therefore, after the synchronization is detected by the orthogonal detection unit 1000, the peak moved toward the harmonic wave (2f0) is removed by the low-pass filter, and removed by the band-pass filter, so that a signal only containing the sideband wave can be extracted.

In order to early detect an abnormality of the rotary machine 1500 from the spectrum illustrated in FIG. 5, the magnitude of weak sideband waves 201 and 202 are needed to be measured. Therefore, it is significantly effective that the main peak 200 is removed by detecting the orthogonal.

FIGS. 6A and 6B are diagrams illustrating a method of determining a frequency characteristic of the low-pass filter 1111 of the input circuit 1110. FIG. 6A illustrates the frequency characteristic of an input signal to the low-pass filter 1111, and FIG. 6B illustrates a pass characteristic of the low-pass filter 1111. The horizontal axis of FIG. 6A represents frequency, and the vertical axis represents amplitude. The horizontal axis of FIG. 6B represents frequency, and the vertical axis represents gain.

Considering that an abnormal signal is detected in the sideband wave near the main peak 200 of the frequency f0, the low-pass filter 1111 (FIG. 2) is desirably designed to pass the frequency f0 of the main peak 200 at minimum. In this case, a cutoff frequency fc of the low-pass filter 1111 is desirably designed to satisfy f0<fc. In a case where a low frequency sampling occurs in a circuit at the later stage, the cutoff frequency fc is designed not so high in order to suppress noise reflecting. The cutoff frequency fc is set to be higher than the frequency f0 of the main peak 200. However, it is effective that the cutoff frequency is set as low as possible in order to detect the sideband wave with accuracy.

FIGS. 7A to 7E illustrate examples of waveforms of the orthogonal detection unit 1000 illustrated in FIG. 1. The horizontal axis of each waveform diagram illustrated in FIGS. 7A to 7E represents time.

Figure 7A:
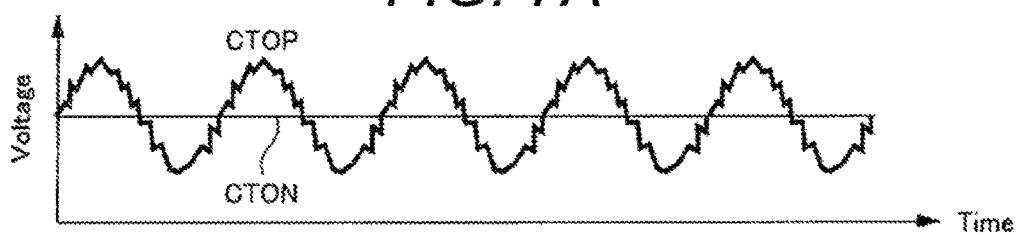
FIGS. 7A to 7E are waveform diagrams illustrating an example of internal operation waveforms of the detection unit according to the first embodiment of the invention.

FIG. 7A illustrates two outputs CTOP and CTON of the current detector 1502. The vertical axis of FIG. 7A represents voltage.

One output CTOP of the current detector 1502 is an analog waveform in which radio frequency noises are superimposed. The other output CTON of the current detector 1502 is a voltage which is adjusted to a potential generated by the level shifter 1113 (FIG. 2).

Figure 7B:
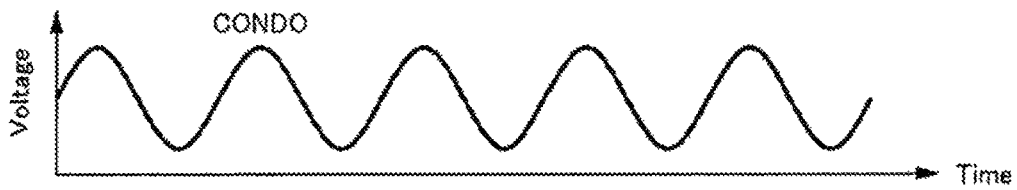

FIG. 7B illustrates the signal CONDO which passes through the low-pass filter 1111 of the input circuit 1110. The vertical axis of FIG. 7B represents voltage.

As illustrated in FIG. 7B, the signal CONDO passed through the low-pass filter 1111 becomes a smooth waveform obtained by removing the radio frequency noises from the output CTOP of the current detector 1502.

Figure 7C:
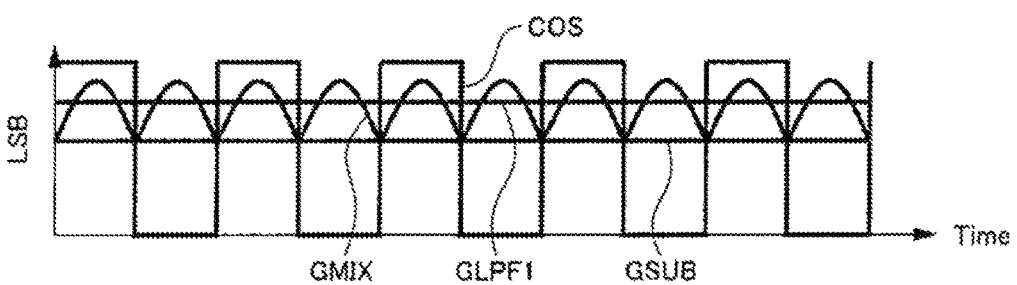

FIG. 7C illustrates a change of the value (LSB) of the gain control path of the digital signal processing unit 1200 of the orthogonal detection unit 1000.

The output GMIX of the gain controlling mixer 1201 is multiplied by the minus sign to be turned over when the signal COS output by the demodulation signal generating mixer 1210 is at a low level "Low" with respect to the waveform of the signal CONDO (FIG. 7B), or is let pass when being at a high level "High".

As illustrated in FIG. 7C, the output GMIX of the gain controlling mixer 1201 is subjected to a low-pass process using the gain controlling low-pass filter 1203 to obtain a smooth waveform output GLPF1. The output GSUB is obtained by subtracting the gain control target value REF from the output GLPF1 of the gain controlling low-pass filter 1203 using the target gain setting subtraction circuit 1205. When the control is stabilized, the output GSUB is statically determined at the reference level.

Figure 7D:
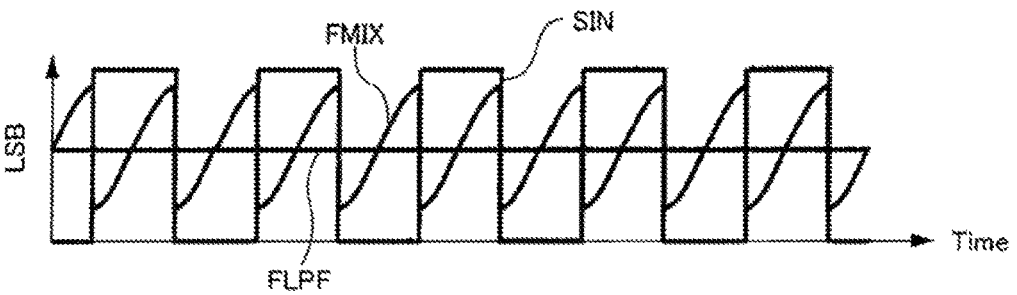
Figure 7E:
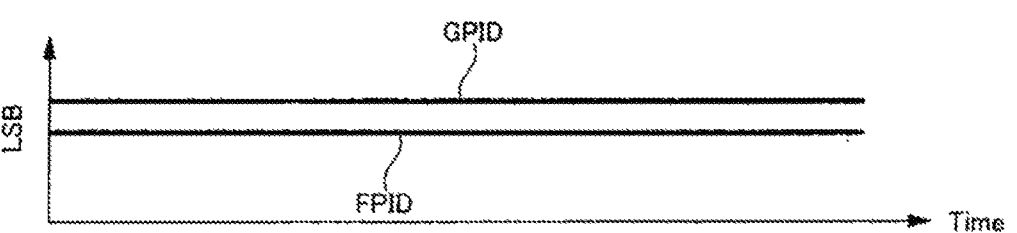

FIG. 7D illustrates a change of the value (LSB) of the frequency control path of the digital signal processing unit 1200 of the orthogonal detection unit 1000.

The output FMIX of the frequency controlling mixer 1202 is multiplied by the minus sign to be turned over when the signal SIN output by the demodulation signal generating mixer 1211 is at a low level "Low" with respect to the waveform of the signal CONDO (FIG. 7B), or is let pass when being at a high level "High".

As illustrated in FIG. 7D, the output FMIX of the frequency controlling mixer 1202 is subjected to a low-pass process using the frequency controlling low-pass filter 1204 to obtain a smooth waveform output FLPF. When the control is stabilized, the output FLPF is statically determined at the reference level as illustrated in FIGS. 7A to 7E.

The gain control output GPID and the frequency control output FPID contain an integral component, and thus do not become zero. The gain control output GPID becomes a waveform containing a DC component in a case where no sideband wave exists, and becomes a waveform with the sideband wave superimposed to the DC component in a case where a sideband wave exists. The frequency control output FPID takes a constant value as long as the frequency control is stabilized, and becomes a value corresponding to f0 in FIG. 5.

Figure 8A:
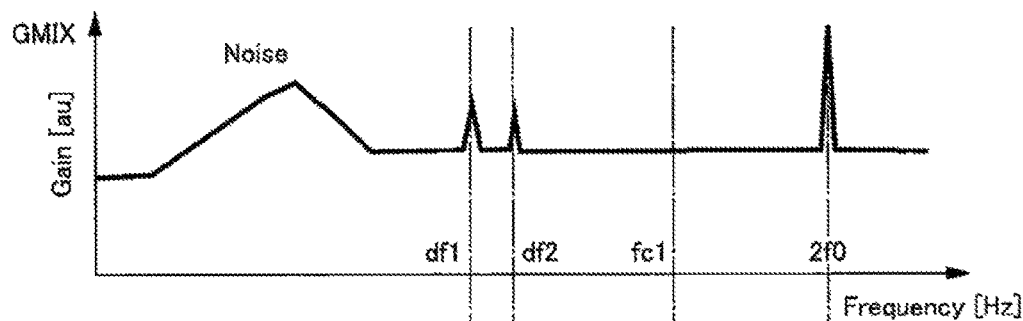
Figure 8B:
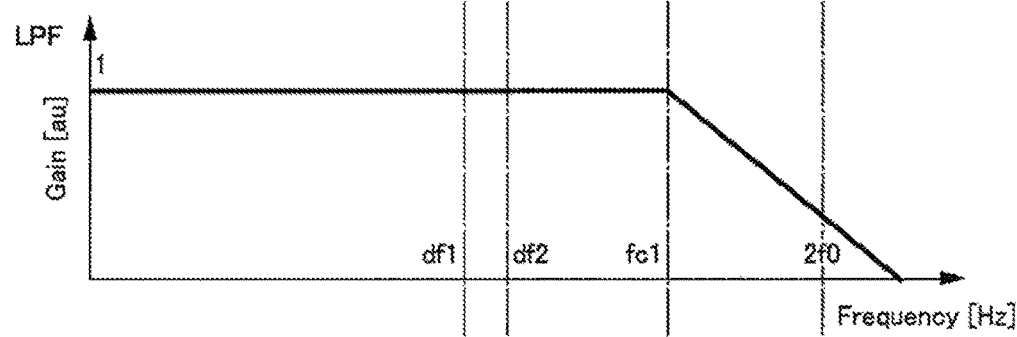
Figure 8C:
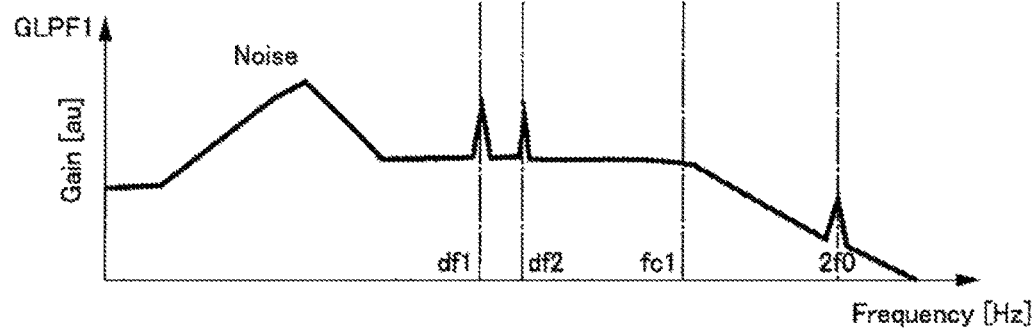

FIGS. 8A to 8C illustrate waveforms of the signal GMIX supplied to the gain controlling low-pass filter 1203 (FIG. 8A), a pass characteristic of the gain controlling low-pass filter 1203 (FIG. 8B), and a waveform after passing through the gain controlling low-pass filter 1203 (FIG. 8C). In each drawing of FIGS. 8A to 8C, the horizontal axis represents frequency, and the vertical axis represents gain.

The input signal GMIX of the gain controlling low-pass filter 1203 vibrates after detecting the synchronization. Therefore, as illustrated in FIG. 8A, the frequency f0 of the main peak of FIG. 5 moves to the frequency 2f0 (two times the DC). The peaks of the first and second sideband waves are observed at the frequencies df1 and df2.

However, in this state, the magnitude of the component of the second harmonic wave 2f0 of the main peak is predominantly large, and thus the component needs to be cut down by the gain controlling low-pass filter 1203. Therefore, as illustrated in FIG. 8B, a cutoff frequency fc1 of the gain controlling low-pass filter 1203 needs to be set smaller than the second harmonic wave 2f0 of the main peak. On the other hand, if the cutoff frequency is not larger than the frequency of the second sideband wave df2, the signal component for observing the abnormality of the rotary machine may be lost.

Under these conditions, the cutoff frequency fc1 of the gain controlling low-pass filter 1203 needs to be set to satisfy df2<fc1<2f0. In addition, in a case where the gain controlling mixer 1201 does not have an ideal characteristic, the component of the first harmonic wave f0 of the main peak shows a large magnitude. In order to suppress this situation, the cutoff frequency fc1 is desirably set to satisfy df2<fc1<f0.

The signal GLPF1 illustrated in FIG. 8C is a signal after passing through the gain controlling low-pass filter 1203, and in which the component of the second harmonic wave 2f0 of the main peak is suppressed and is prepared to extract the sideband wave component with accuracy.

However, in the signal GLPF1 illustrated in FIG. 8C, there are noises left in the low frequency band (Noise in the drawing). The low-frequency noises are removed by the band-pass filter 1208 (FIG. 1).

Figure 9A:
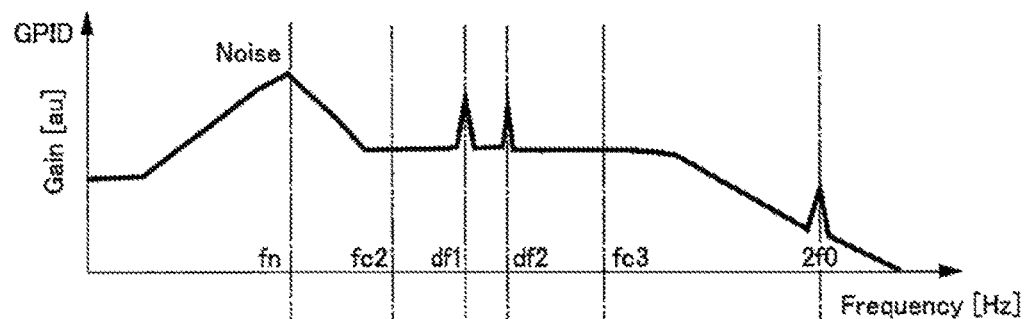
Figure 9B:
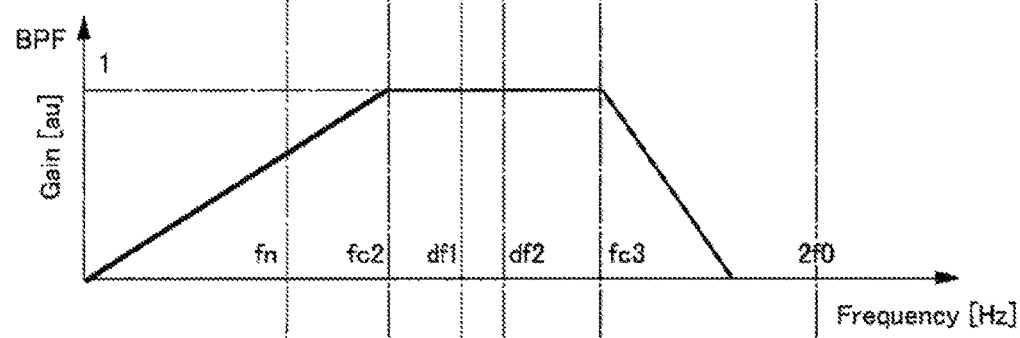
Figure 9C:
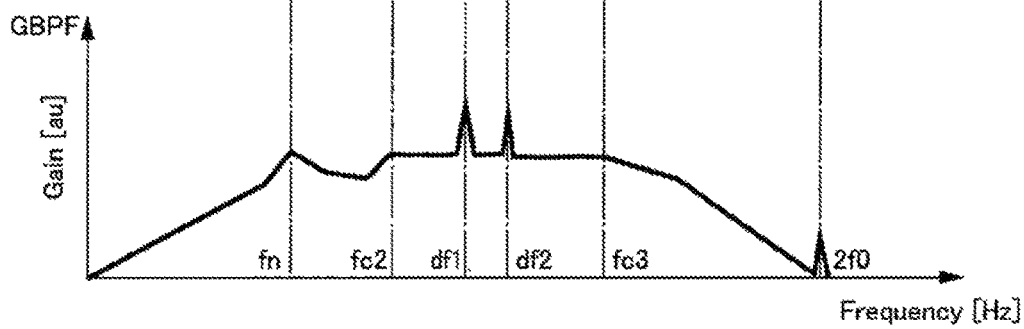

Next, the characteristic of the band-pass filter 1208 which removes the low-frequency noises will be described using FIGS. 9A to 9C. The horizontal axis of each characteristic drawing illustrated in FIGS. 9A to 9C represents frequency, and the vertical axis represents gain. FIG. 9A illustrates the spectrum of the output GPID of the gain controller 1206. FIG. 9B illustrates the frequency characteristic of the band-pass filter 1208. FIG. 9C illustrates the spectrum of the waveform GBPF after passing through the band-pass filter 1208.

In the output GPID of the gain controller 1206, a noise is left in the low frequency band (Noise in the drawing). Therefore, the noise is removed by the band-pass filter 1208 which has a passing band from a frequency fc3 to a frequency fc2. At this time, a cutoff frequency fc2 on the lower side is set to satisfy fn<fc2<df1 in which the noise frequency is fn. A cutoff frequency fc3 on the lower side is desirably set to satisfy df2<fc3<2f0. With this configuration, as illustrated in FIG. 9C, the noise in the low frequency band is removed, and the sideband wave components df1 and df2 can be extracted with accuracy.

Figure 10A:
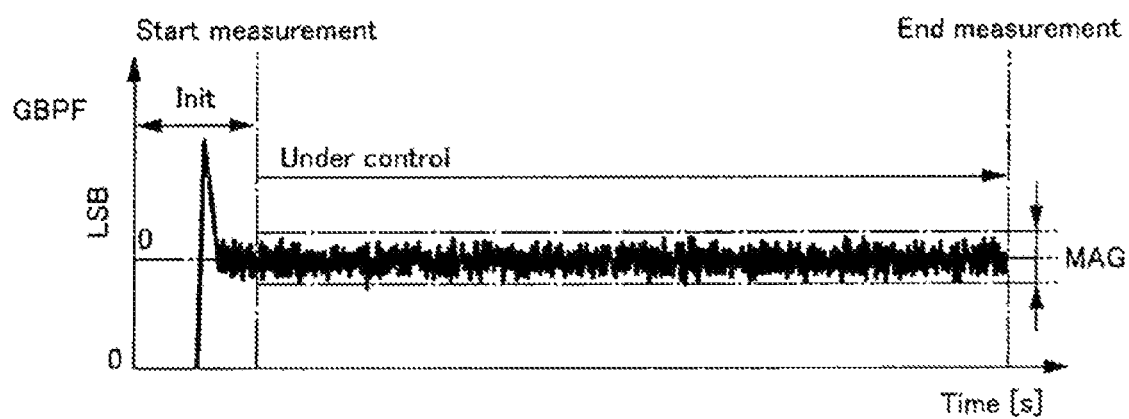
FIG. 10A is a diagram illustrating a time-sequential waveform of the output GBPF of the band-pass filter 1208 according to the first embodiment of the invention.

FIG. 10A illustrates an example of a time-sequential waveform of the output GBPF of the band-pass filter 1208. In FIG. 10A, the horizontal axis represents time, and the vertical axis represents value (LSB).

Figure 10B:
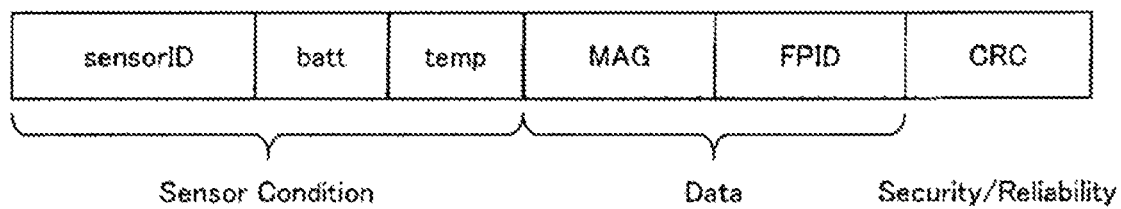
FIG. 10B is a first exemplary configuration of an uplink transmission packet.

In addition, FIG. 10B illustrates an example of the configuration of a packet PKTUP of a communication payload which is transmitted by the communication circuit 1300 in a case where the output GBPF is obtained.

As illustrated in FIG. 10A, a time zone (Init) before the output of the gain control is statically determined after activation is defined as an activation sequence, and the output calculation unit 1212 finally outputs an AC amplitude value MAG of the output where the period (Init) is excluded. The AC amplitude value MAG has the magnitude containing the components of the first and second sideband waves. Therefore, the value of the AC amplitude value MAG becomes increased when the rotary machine 1500 is degraded, and becomes a value near zero in a normal case.

In the packet PKTUP of the uplink communication, as illustrated in FIG. 10B, information (Sensor Condition) indicating a sensor condition, data (Data) such as the AC amplitude value MAG and the frequency control output FPID, and security/reliability guarantee information (CRC) are disposed.

The information indicating the sensor condition includes the sensor serial number sensorID, battery residual information batt, and temperature information temp. The packet PKTUP containing such information is transmitted to the host (the calculation node 131 of the cloud calculator 130) of the system, so that the diagnosis result can be calculated by the host.

Specifically, the magnitude of the AC amplitude value MAG itself indicates an abnormality. The frequency control output FPID is used to check whether the synchronization detection is normally operated. Further, the frequency f0 of the main peak is linked to a driving speed of the rotary machine 1500. In a situation where a number of rotary machines 1500 are monitored at the same time, the soundness of the entire conveyance line can be determined from the frequency f0 of the main peak.

Next, the description will be given about an example in a case where the output calculation unit 1212 illustrated in FIG. 1 performs a calculation to obtain the spectrums of the first sideband wave and the second sideband wave. In other words, in the examples illustrated in FIGS. 10A and 10B, the AC amplitude value MAG has been described to be transmitted to the host. However, the spectrums of the first sideband wave and the second sideband wave may be analyzed to transmit the magnitude to the host. In a case where the output calculation unit 1212 analyzes the spectrums of the first sideband wave and the second sideband wave, the output calculation unit 1212 performs a calculation of the fast Fourier transformation (FFT). The FFT calculation herein is a calculation to obtain a spectrum by performing the FFT calculation on the AC amplitude value MAG. The sideband wave is at a significantly low frequency (several Hz) compared to performing the FFT on raw data, so that the sampling rate can be reduced, and a calculation amount can be suppressed low.

Figure 11A:
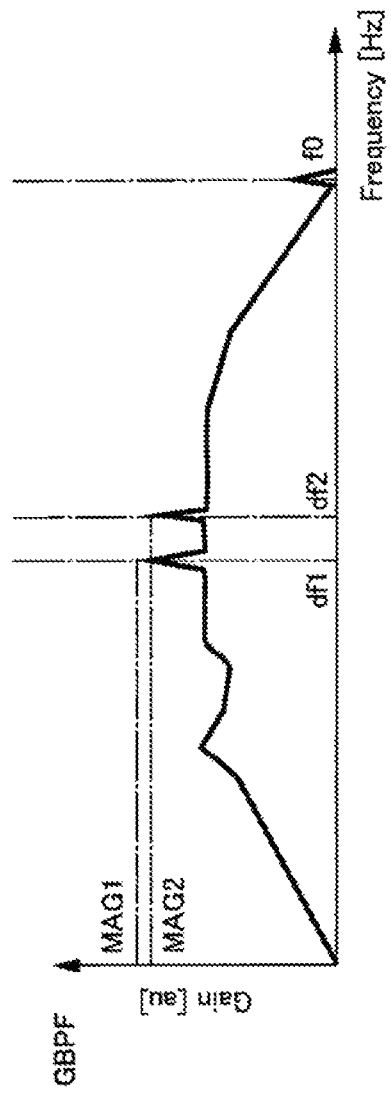
FIG. 11A is a diagram illustrating a spectrum of the output GBPF of the band-pass filter 1208 according to the first embodiment of the invention.
Figure 11B:
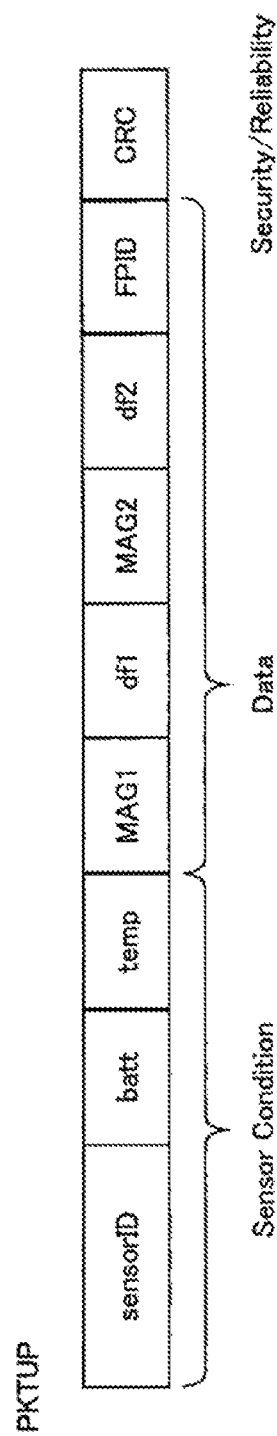
FIG. 11B is a second exemplary configuration of an uplink transmission packet.

FIGS. 11A and 11B illustrate examples in a case where the output calculation unit 1212 analyzes the spectrums of the first sideband wave and the second sideband wave from the AC amplitude value MAG.

FIG. 11A illustrates the spectrum of the AC amplitude value MAG. The horizontal axis of FIG. 11A represents frequency, and the vertical axis represents gain.

FIG. 11B illustrates an exemplary configuration of a transmission packet where the magnitudes and the frequencies of the first sideband wave and the second sideband wave obtained by analyzing the spectrum of the AC amplitude value MAG are disposed.

In a case where the frequency of the AC amplitude value MAG illustrated in FIG. 11A is analyzed, the magnitude MAG1 and the frequency df1 of the first sideband wave and the magnitude MAG2 and the frequency df2 of the second sideband wave are obtained.

The magnitude MAG1 and the frequency df1 of the first sideband wave and the magnitude MAG2 and the frequency df2 of the second sideband wave obtained as above are disposed in data (Data) of the packet PKTUP of the communication payload which is transmitted by the communication circuit 1300 as illustrated in FIG. 11B. The other contents of the packet PKTUP are the same as the configuration of FIG. 10B.

Figure 12:
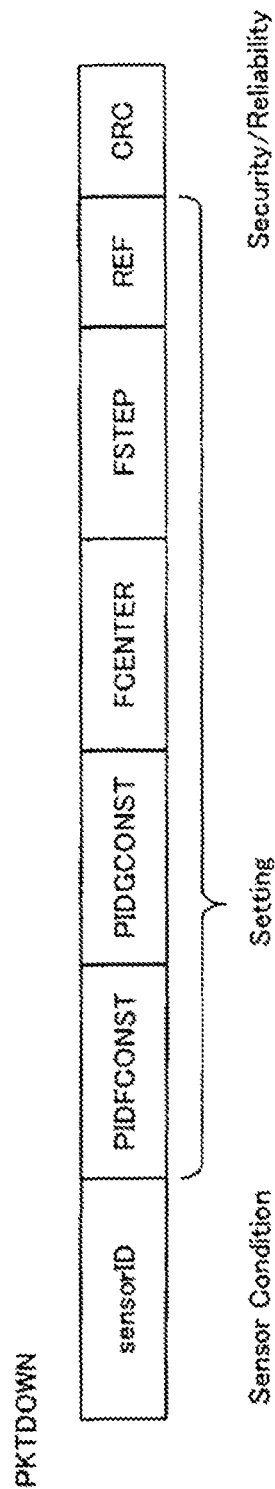
FIG. 12 is a diagram illustrating an exemplary configuration of a downlink transmission packet according to the first embodiment of the invention.

FIG. 12 illustrates an example of the configuration of a packet PKTDOWN which is received by the communication circuit 1300 in downlink from the host system (the cloud calculator 130 of FIG. 3).

In the packet PKTDOWN, there are disposed sensorID to identify information, setting data (setting), and CRC information.

As the setting data (setting), there are disposed the frequency control coefficient PIDFCONST, the gain control coefficient PIDGCONST, the center frequency FCENTER of the variable control oscillation circuit, the frequency gain FSTEP of a control transmitter, and a gain control target REF.

Further, these setting data does not need to be transmitted at every activation. In a case where the synchronization detection is not performed well or the device is installed, the setting data is transmitted, and the setting data received by each measurement site is stored. With such a configuration, the downlink communication can be suppressed as low as possible, and power consumption for system operation can be reduced. In particular, since the downlink communication requires much power consumption, the effect is more increased by reducing the number of times of downlink communication.

Further, in the orthogonal detection unit 1000 illustrated in FIG. 1, the analog-digital conversion circuit 1120 of the analog front end 1100 is used to process digitized data. With this regard, the orthogonal detection unit 1000 may receive the output CONDO as an analog signal of the input circuit 1110, and convert the signal into a digital signal in the orthogonal detection unit 1000.

Figure 13:
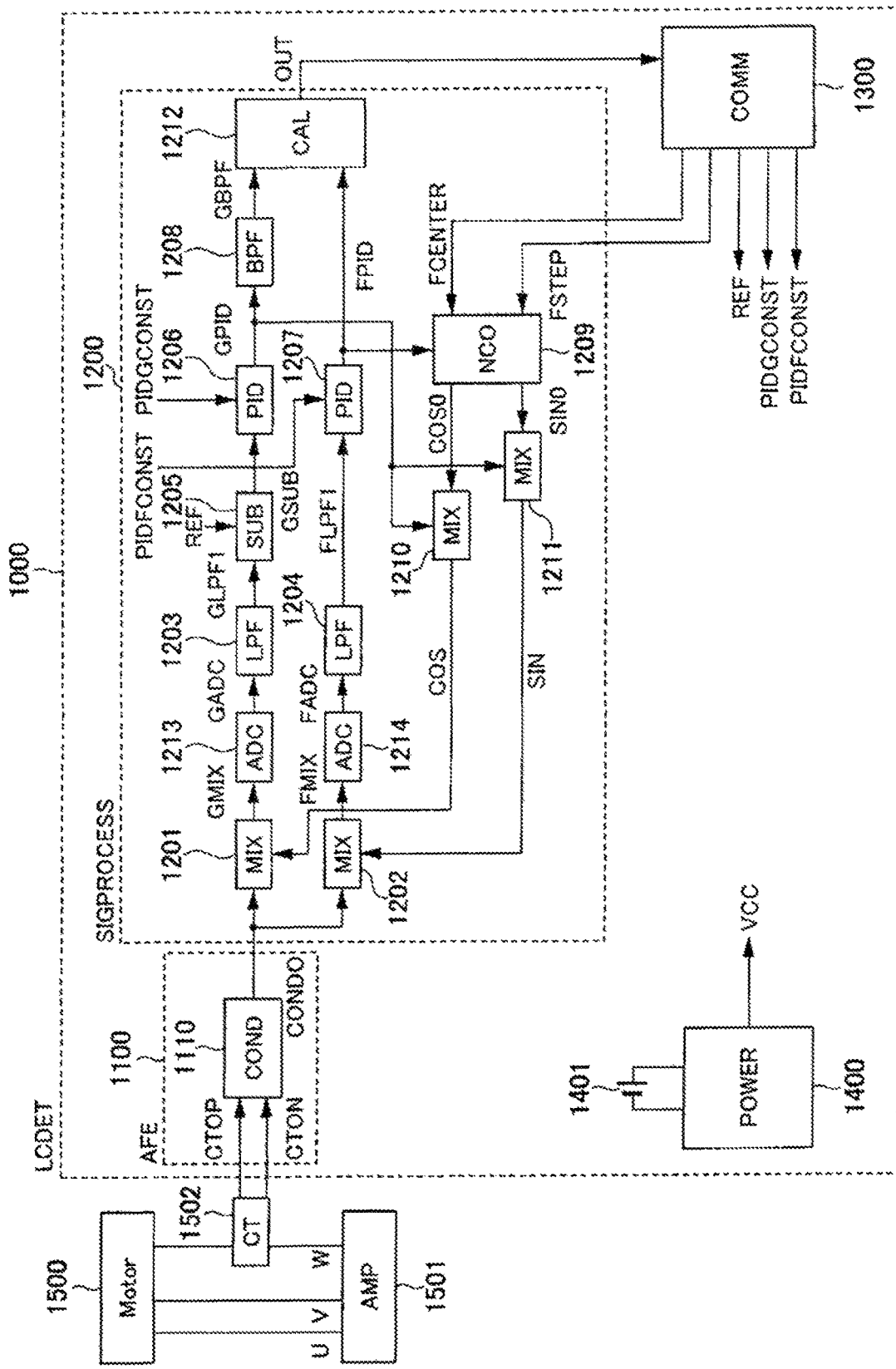
FIG. 13 is a block diagram illustrating an exemplary configuration (first modification) of the detection unit of the first embodiment of the invention.
Figure 14:
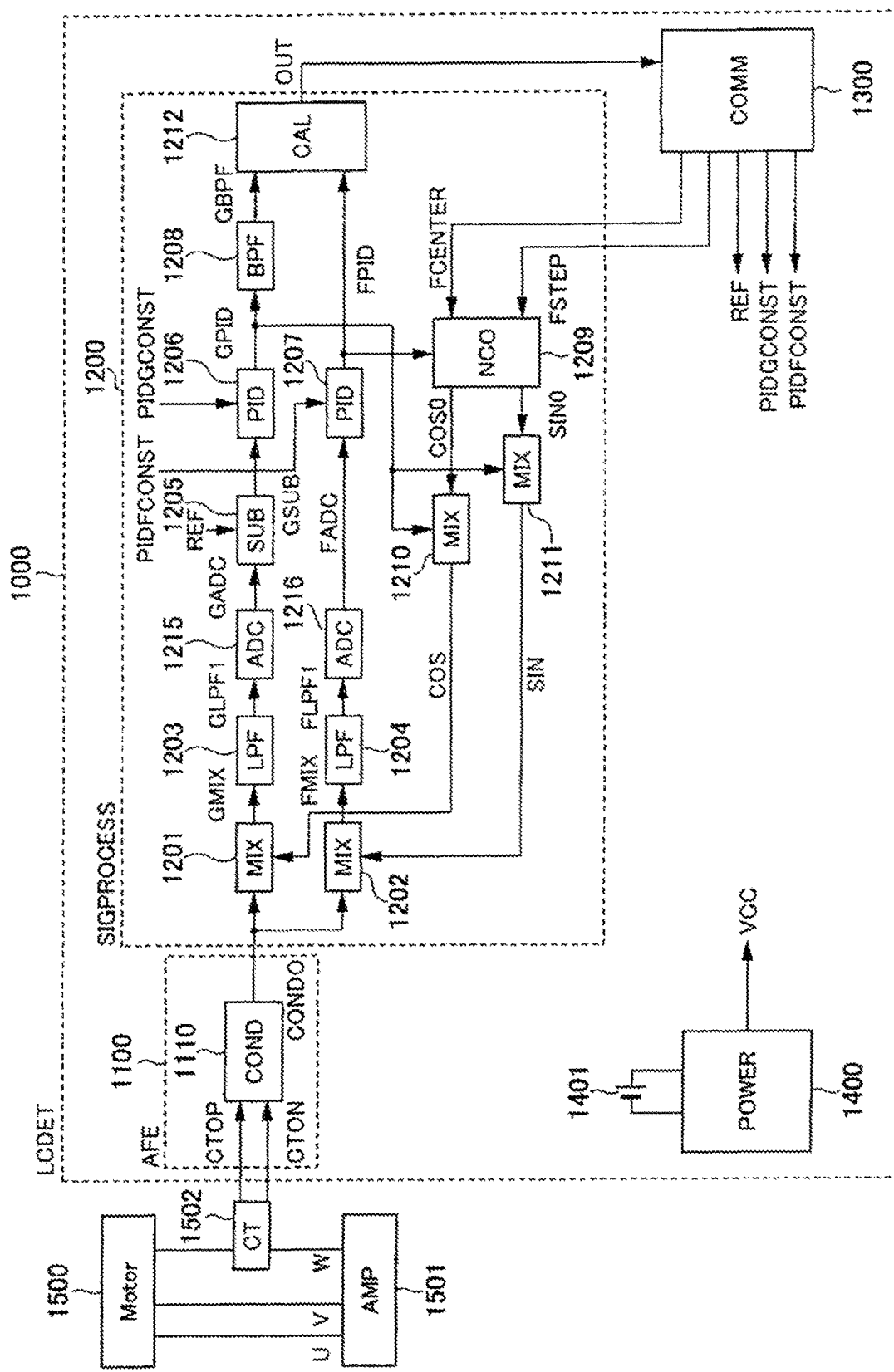
FIG. 14 is a block diagram illustrating an exemplary configuration (second modification) of the detection unit of the first embodiment of the invention.

FIGS. 13 and 14 illustrate an exemplary configuration in a case where the orthogonal detection unit 1000 includes the analog-digital conversion circuit.

In the example illustrated in FIG. 13, the analog front end 1100 includes the input circuit 1110, and supplies the output CONDO (analog signal) of the input circuit 1110 to the digital signal processing unit 1200. The digital signal processing unit 1200 performs an analog signal processing using the gain controlling mixer 1201 and the frequency controlling mixer 1202, and obtains the output GMIX of the gain controlling mixer 1201 and the output FMIX of the frequency controlling mixer 1202.

Then, the output GMIX of the gain controlling mixer 1201 is supplied to an analog-digital conversion circuit 1213 to obtain a digital output GADC, and the digital output GADC is supplied to the gain controlling low-pass filter 1203.

In addition, the output FMIX of the frequency controlling mixer 1202 is supplied to an analog-digital conversion circuit 1214 to obtain a digital output FADC, and the digital output FADC is supplied to the frequency controlling low-pass filter 1204.

The other places of the orthogonal detection unit 1000 illustrated in FIG. 13 are configured similarly to the orthogonal detection unit 1000 illustrated in FIG. 1.

The example illustrated in FIG. 14 is an example in which the gain controlling low-pass filter 1203 and the frequency controlling low-pass filter 1204 are also configured by an analog circuit, and analog-digital conversion circuits 1215 and 1216 are disposed at the later stage of both filters 1203 and 1204.

In this case, the gain controlling low-pass filter 1203 supplies the output GLPF1 to the analog-digital conversion circuit 1215, and supplies the converted digital signal GADC to the target gain setting subtraction circuit 1205. In addition, the frequency controlling low-pass filter 1204 supplies the output FLPF1 to the analog-digital conversion circuit 1216, and supplies the converted digital signal FADC to the frequency controller 1207.

The other places of the orthogonal detection unit 1000 illustrated in FIG. 14 is configured similarly to the orthogonal detection unit 1000 illustrated in FIG. 13.

As illustrated in FIGS. 13 and 14, even in a case where the orthogonal detection unit 1000 is configured to perform the digital conversion process, it is possible to obtain a signal according to the magnitudes of the first sideband wave and the second sideband wave similarly to the configuration of FIG. 1.

In addition, in the configuration described so far, the battery 1401 or the energy harvesting device is provided as the power source circuit 1400 of the orthogonal detection unit 1000. With this regard, as the power source circuit 1400, the current detected from the power line connected to the rotary machine 1500 may be used as a power source.

Figure 15:
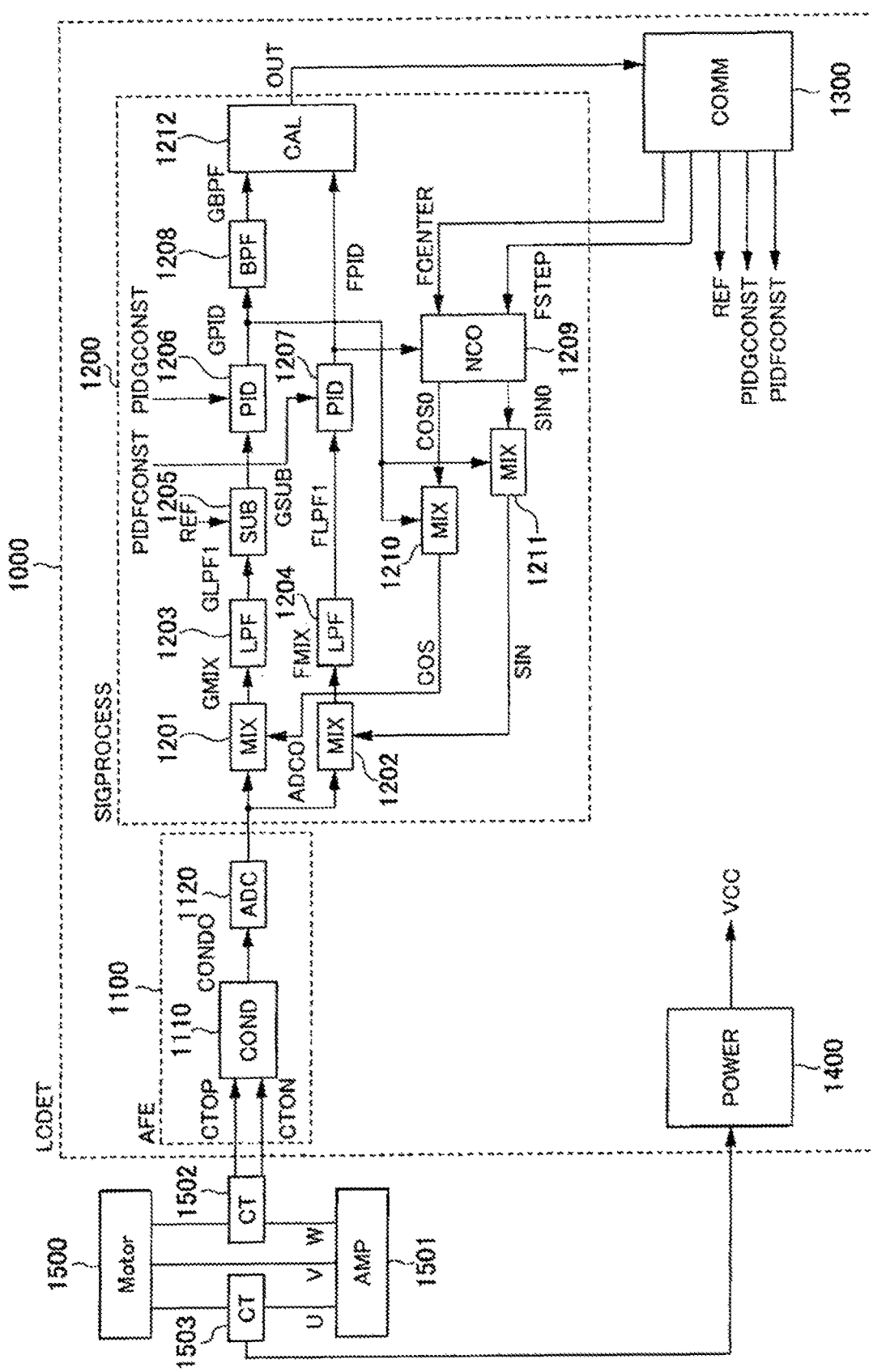
FIG. 15 is a block diagram illustrating an exemplary configuration (third modification) of the detection unit of the first embodiment of the invention.

In other words, as illustrated in FIG. 15, a power detector 1503 is disposed in the u-phase power line of the rotary machine 1500, and the current obtained by the power detector 1503 is supplied to the power source circuit 1400. The current obtained from the u-phase power line is an example, and the power lines of other phases may be used. However, the current is desirably obtained from the power line different from the power detector 1503 which is used to detect an abnormality.

Then, the power source circuit 1400 obtains the power source voltage VCC to operate the orthogonal detection unit 1000 from the current obtained by the power detector 1503.

The other configurations of the orthogonal detection unit 1000 illustrated FIG. 15 are configured similarly to the orthogonal detection unit 1000 illustrated in FIG. 1.

In this way, the power to operate the orthogonal detection unit 1000 is configured to be obtained from the power to operate the rotary machine 1500, so that there is no need of battery, and the power source can be simply configured.

Second Embodiment

Next, a second embodiment of the invention will be described with reference to FIGS. 16 to 18C. In FIGS. 16 to 18C, the same places as FIGS. 1 to 15 described in the first embodiment will be attached with the same symbol, and the redundant description will be omitted.

Figure 16:
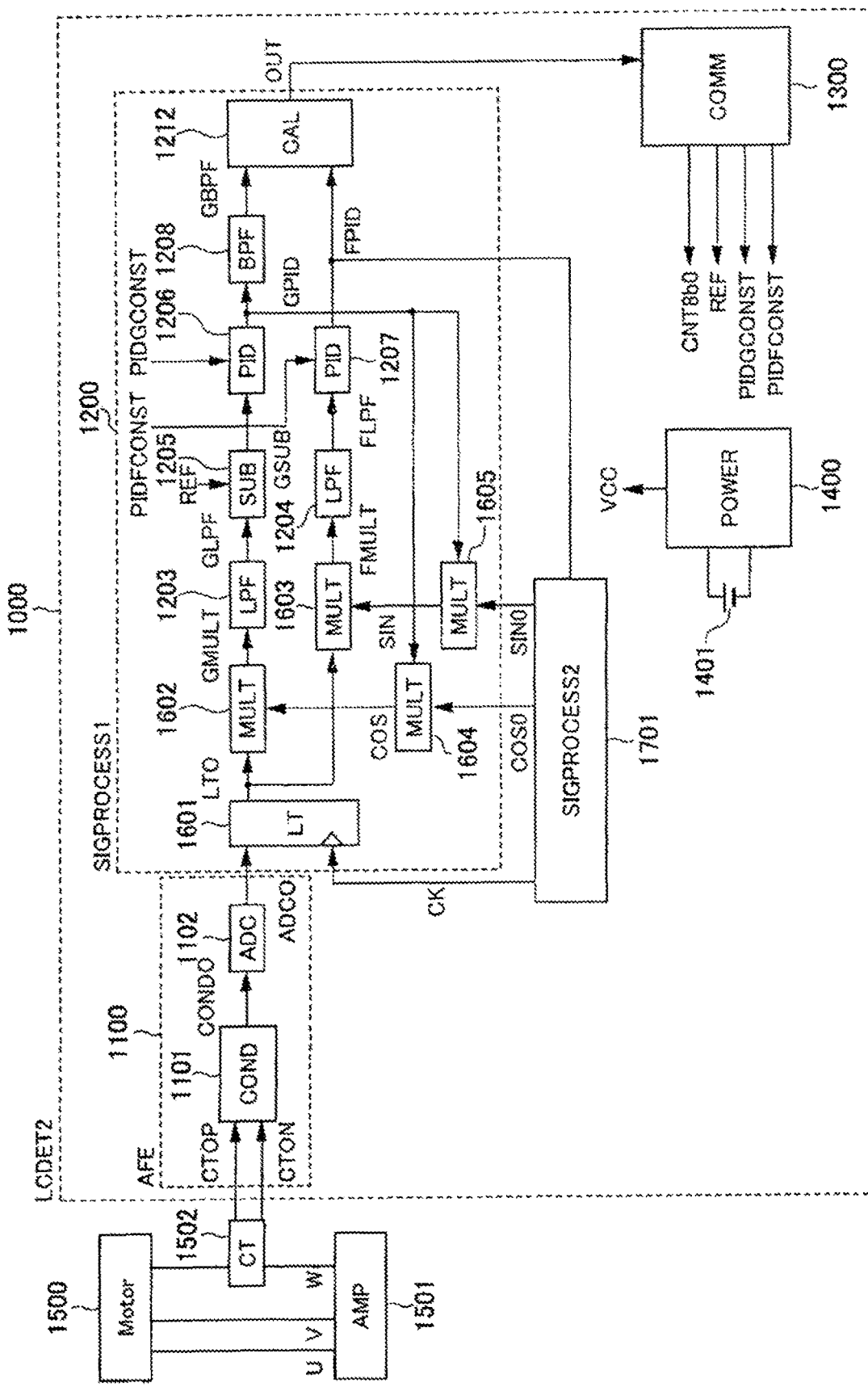
FIG. 16 is a block diagram illustrating an exemplary configuration of the detection unit of a second embodiment of the invention.

FIG. 16 is a diagram illustrating a configuration of the orthogonal detection unit 1000 in the second embodiment.

The orthogonal detection unit 1000 illustrated in FIG. 16 is provided with a frequency calculation unit 1701 instead of the variable control oscillation circuit 1209 illustrated in FIG. 1. In addition, as the digital signal processing unit 1200, there are provided a data latch 1601 which latches the input ADCO, and multiplication logic units 1602, 1603, 1604, and 1605.

In other words, the data latch 1601 of the digital signal processing unit 1200 latches the input ADCO in synchronization with a clock CK supplied from the frequency calculation unit 1701 so as to obtain a latch output LTO. Further, the data latch 1601 performs sampling at a frequency significantly faster than the frequency of the main peak.

The latch output LTO of the data latch 1601 is supplied to the multiplication logic units 1602 and 1603. The multiplication logic unit 1602 supplies a logical operation output GMULT between the output COS and the latch output LTO of another multiplication logic unit 1604 to the gain controlling low-pass filter 1203. The multiplication logic unit 1604 obtains the multiplication output COS by a logical operation between the output GPID of the gain controller 1206 and the output COS0 of the frequency calculation unit 1701.

In addition, the multiplication logic unit 1603 supplies a logical operation output FMULT between the output SIN and the latch output LTO of another multiplication logic unit 1605 to the frequency controlling low-pass filter 1204. The multiplication logic unit 1605 obtains the multiplication output SIN by a logical operation between the output GPID of the gain controller 1206 and the output SIN0 of the frequency calculation unit 1701.

The frequency calculation unit 1701 includes an oscillator which generates the clock CK and a circuit which generates the outputs COS0 and SIN0 on the basis of the count operation of the output of the oscillator.

Figure 17A:
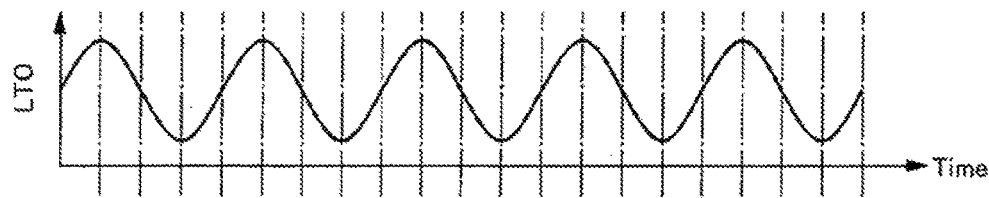
FIGS. 17A to 17C are waveform diagrams illustrating an example of the internal operation waveform of the detection unit according to the second embodiment of the invention.
Figure 17B:
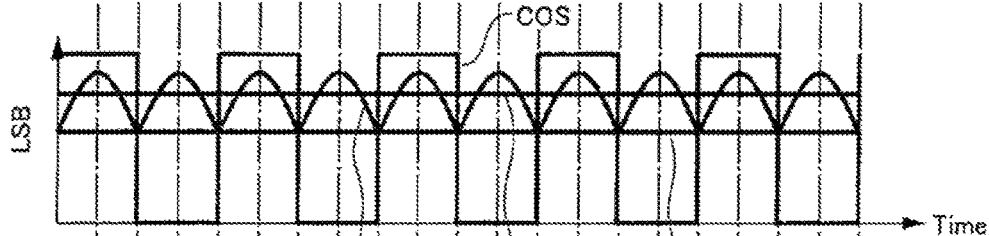
Figure 17C:
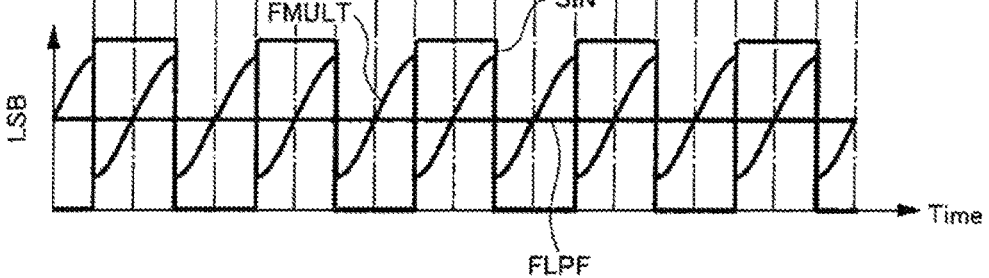

FIGS. 17A to 17C illustrate examples of waveforms of the orthogonal detection unit 1000 illustrated in FIG. 16. The horizontal axis of each waveform diagram illustrated in FIGS. 17A to 17C represents time.

FIG. 17A illustrates a change of the output LTO of the data latch 1601. The waveform of the output LTO becomes a waveform as smooth as an analog waveform in order to perform sampling at a frequency significantly fast with respect to the frequency of the main peak.

FIG. 17B illustrates a change of a value (LSB) of the gain control path of the orthogonal detection unit 1000 illustrated in FIG. 16.

The logical operation output GMULT of the multiplication logic unit 1602 becomes a waveform which is multiplied by the minus sign to be turned over when the signal COS output by the multiplication logic unit 1604 is at a low level "Low", or is let pass when being at a high level "High".

The logical operation output GMULT of the multiplication logic unit 1602 is subjected to a low-pass process using the gain controlling low-pass filter 1203 to obtain the smooth waveform output GLPF1. The output GSUB is obtained by subtracting the gain control target value REF from the output GLPF1 of the gain controlling low-pass filter 1203 using the target gain setting subtraction circuit 1205. When the control is stabilized, the output GSUB is statically determined at the reference level.

FIG. 17C illustrates a change of the value (LSB) of the frequency control path of the orthogonal detection unit 1000.

The logical operation output FMULT of the multiplication logic unit 1603 is multiplied by the minus sign to be turned over when the signal SIN output by the multiplication logic unit 1605 is at a low level "Low", or is let pass when being at a high level "High".

The logical operation output FMULT of the multiplication logic unit 1603 is subjected to a low-pass process using the frequency controlling low-pass filter 1204 to obtain a smooth waveform output FLPF. When the control is stabilized, the output FLPF is statically determined at the reference level.

The waveforms illustrated in FIG. 17A to 17C is the same as the operation waveforms illustrated in FIGS. 7A to 7E of the first embodiment, and it is determined whether the synchronization detection is performed similarly to the first embodiment from the waveforms illustrated in FIG. 17A to 17C.

In the case of the orthogonal detection unit 1000 of this embodiment illustrated in FIG. 16, the digital signal processing unit 1200 and the frequency calculation unit 1701 are configured by a pure logic circuit. Therefore, the orthogonal detection unit 1000 can be configured by various mounting method such as a logic circuit, an FPGA, and software executed on a microcomputer.

Herein, the speed required for the measurement system varies according to the frequency of the main peak of a target rotary machine. Therefore, an optimal mounting method may be selected according to the speed.

Further, in the frequency calculation unit 1701 illustrated in FIG. 16, the output of the oscillator is supplied to the data latch 1601 as a direct clock CK. With this regard, the count value of the clock CK output by the oscillator and the frequency control output FPID of the frequency controller 1207 are compared in the frequency calculation unit 1701, and a reset signal as a comparison result may be supplied to the data latch 1601 as clocks.

In this way, the data latch 1601 performs a latch operation using the reset signal, so that the latch period can be reduced. A load of the digital signal processing unit 1200 can be reduced.

Further, in this case, the analog-digital conversion circuit 1120 is intermittently driven using the reset signal as a trigger, so that the current consumption in the analog-digital conversion circuit 1120 can be reduced.

Figure 18A:
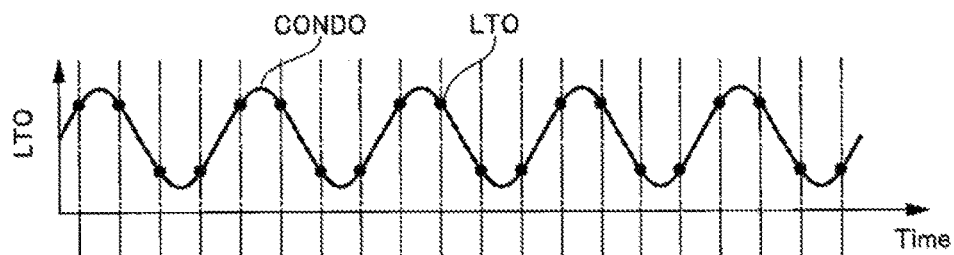
FIGS. 18A to 18C are waveform diagrams illustrating an example of an operation waveform in a case where a data latch performs a latch operation with a reset signal in the detection unit of the second embodiment of the invention.
Figure 18B:
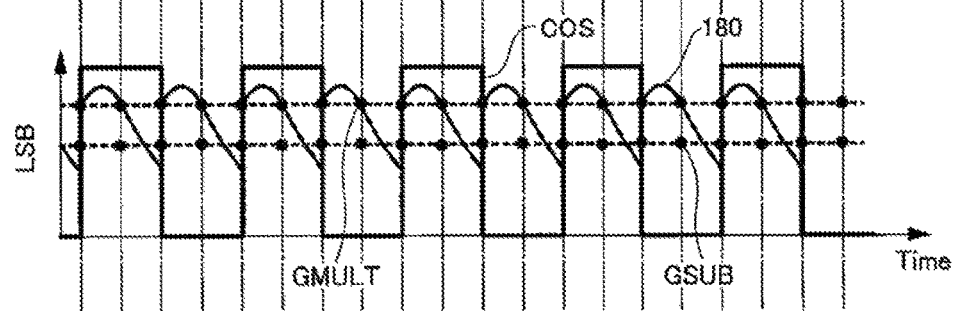
Figure 18C:
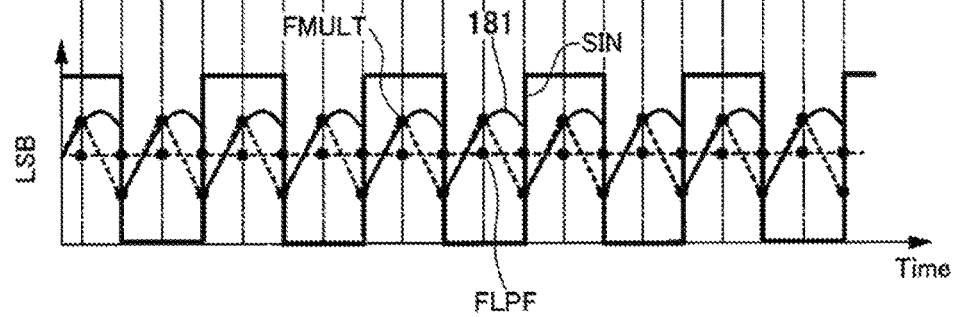

FIGS. 18A to 18C are operation waveforms in a case where the data latch 1601 in the orthogonal detection unit 1000 illustrated in FIG. 16 performs the latch operation using the reset signal.

FIG. 18A illustrates a change of the output LTO of the data latch 1601. The output LTO has a sampling frequency 4f0 in a case where the frequency control is statically determined. The output LTO (analog waveform) becomes an output obtained by sampling the value at positions depicted with black circles in the drawing.

FIG. 18B illustrates a change of the value (LSB) of the gain control path of the orthogonal detection unit 1000 illustrated in FIG. 16.

The logical operation output GMULT of the multiplication logic unit 1602 becomes a waveform which is multiplied by the minus sign to be turned over when the signal COS output by the multiplication logic unit 1604 is at a low level "Low", or is let pass when being at a high level "High". A multiplication result 180 in a case where there is an analog waveform (FIG. 18B) and the waveform of the logical operation output GMULT in FIG. 17B become different.

FIG. 18C illustrates a change of the value (LSB) of the frequency control path of the orthogonal detection unit 1000.

The logical operation output FMULT of the multiplication logic unit 1603 is multiplied by the minus sign to be turned over when the signal SIN output by the multiplication logic unit 1605 is at a low level "Low", or is let pass when being at a high level "High". A multiplication result 181 in a case where there is an analog waveform (FIG. 18C) and the waveform of the logical operation output FMULT in FIG. 17C become different.

The waveforms illustrated in FIGS. 18A to 18C are the same in terms of the LSB value while the operation waveform and the sampling frequency illustrated in FIGS. 7A to 7E of the first embodiment are different, and it is determined whether the synchronization detection is performed similarly to the first embodiment from the waveforms illustrated in FIG. 18A to 18C.

FIGS. 19A and 19B illustrate frequency characteristics of the low-pass filter 1111 (FIG. 2) of the input circuit 1110 in a case where the data latch 1601 performs the latch operation using the reset signal. FIG. 19A illustrates the frequency characteristic of the output ADCO of the analog-digital conversion circuit 1120, in which the horizontal axis represents frequency, and the vertical axis represents amplitude. FIG. 19A illustrates the characteristic of the low-pass filter 1111, in which the horizontal axis represents frequency, and the vertical axis represents gain.

A cutoff frequency fc4 of the low-pass filter 1111 needs to be larger than the frequency f0 of the main peak. However, in a case where the sampling frequency of the data latch 1601 becomes the frequency 4f0 in a case where the control is statically determined. Therefore, as illustrated in FIG. 19B, the cutoff frequency fc4 needs to be set to satisfy f0<fc4<4f0.

In this way, the cutoff frequency 4f0 of the low-pass filter 1111 is set as described above, so that the noise reflecting at the time of data acquisition in the data latch 1601 can be reduced, and the measurement can be made with accuracy.

<Modifications>

Further, the present invention is not limited to the above embodiments, but various modifications may be contained. For example, the above-described embodiments have been described in detail in a clearly understandable way of the invention, and are not necessarily limited to those having all the described configurations. In addition, the configurations of a plurality of embodiments may be combined.

For example, in the configuration illustrated in FIGS. 1 and 3, the orthogonal detection unit 1000 is configured to detect the output signal of the current detector 1502 of one rotary machine 1500. With this regard, one orthogonal detection unit 1000 may detect the output signals of a plurality of current detectors 1502.

Figure 20:
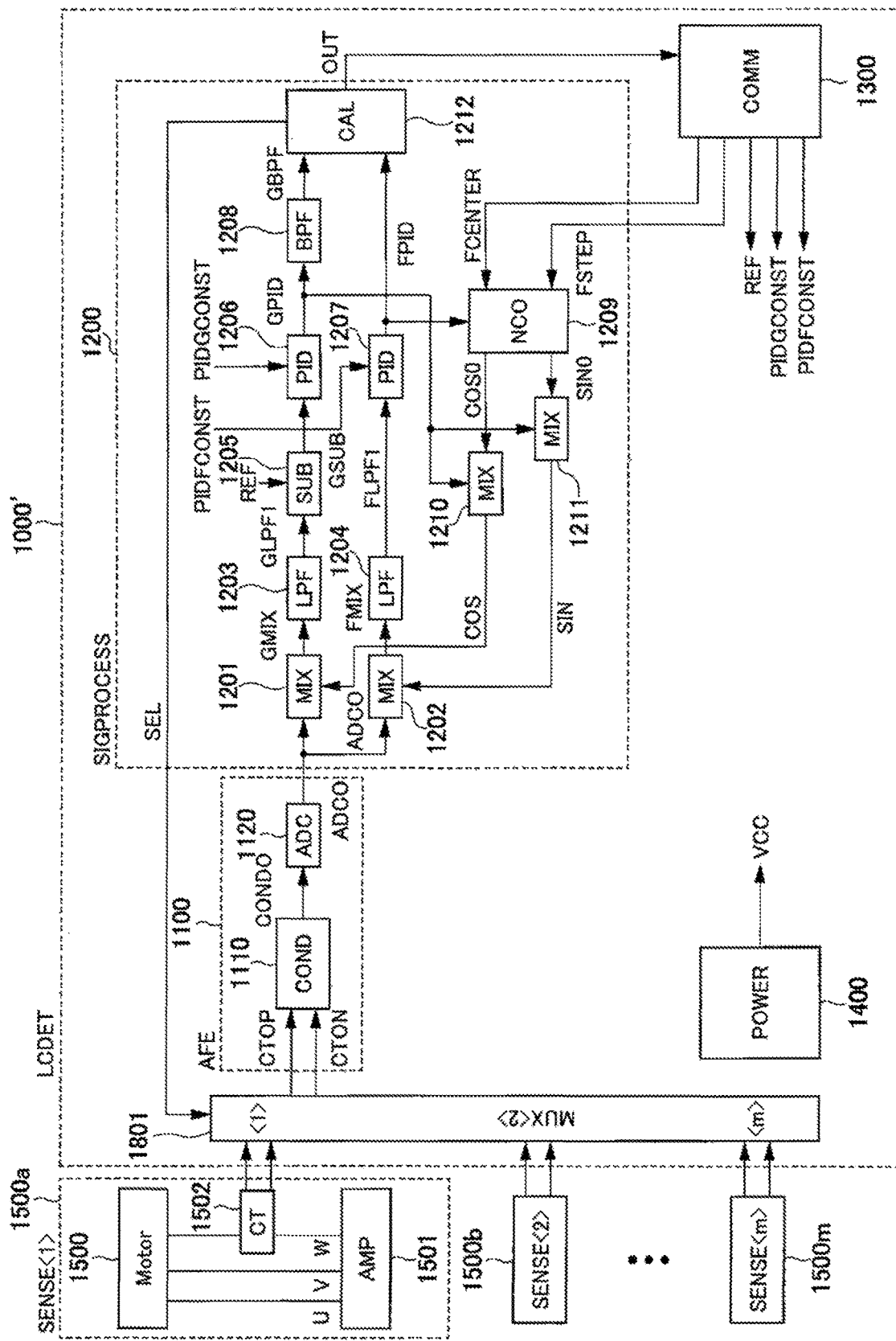
FIG. 20 is a block diagram illustrating an exemplary configuration (modification) of the detection unit of the first embodiment of the invention.

FIG. 20 illustrates a configuration in a case where one orthogonal detection unit 1000' detects the output signals of the plurality of current detectors 1502.

In the configuration illustrated in FIG. 20, m (m is any integer) rotary machines 1500a to 1500m are prepared, and the current detector 1502 is separately provided in each of the m rotary machines 1500a to 1500m. Then, the output signal of each current detector 1502 is supplied to a multiplexer 1801 of the orthogonal detection unit 1000'. The multiplexer 1801 sequentially switches the input signals to be supplied to the analog front end 1100 on the basis of a select signal SEL supplied from the output calculation unit 1212.

The configurations of the analog front end 1100 and the digital signal processing unit 1200 of the orthogonal detection unit 1000' are similar to those of the orthogonal detection unit 1000 illustrated in FIG. 1.

Figure 21A:
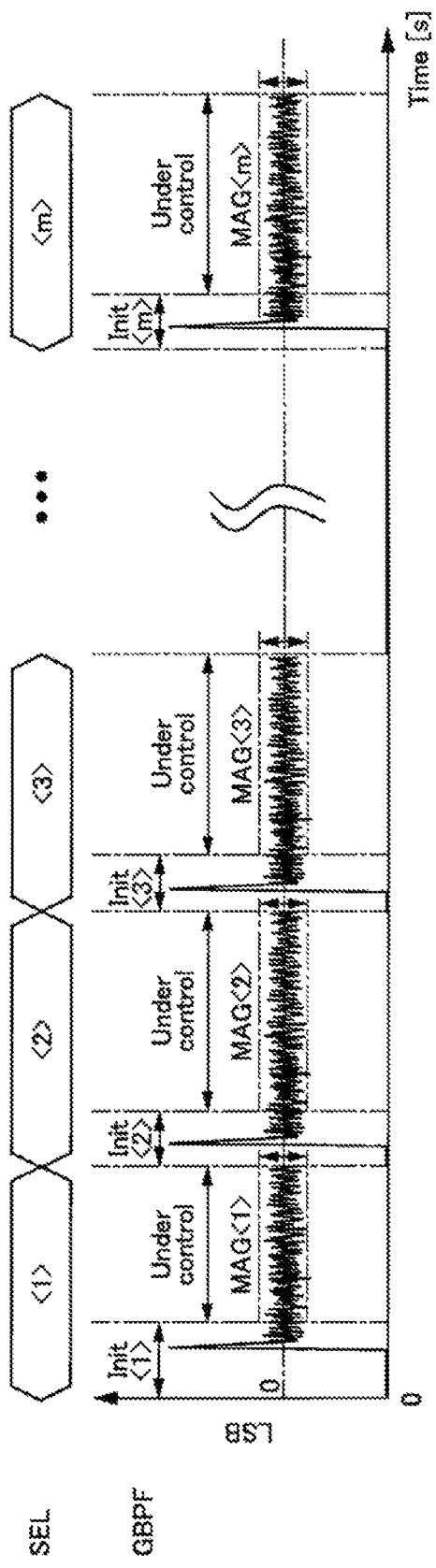
FIGS. 21A and 21B are diagrams illustrating an exemplary configuration of a detection timing and a transmission packet in the case of the exemplary configuration illustrated in FIG. 20.

FIG. 21A illustrates the select signal SEL to be supplied to the multiplexer 1801 and the output GBPF of the band-pass filter 1208 to be supplied to the output calculation unit 1212 in the case of the orthogonal detection unit 1000' of the configuration illustrated in FIG. 20.

As illustrated in FIG. 21A, the select signal SEL to switch the m current detectors 1502 is sent to the multiplexer 1801. In conjunction of with the switching of the select signal SEL, the AC amplitude value MAG of the output of one current detector 1502 is obtained. Herein, in a period when the AC amplitude value MAG of each current detector 1502 is output, a time zone (Init) before the output of the gain control is statically determined after activation is defined, and the AC amplitude value MAG of a period excluding the time zone (Init) before the static determination is measured.

Figure 21B:
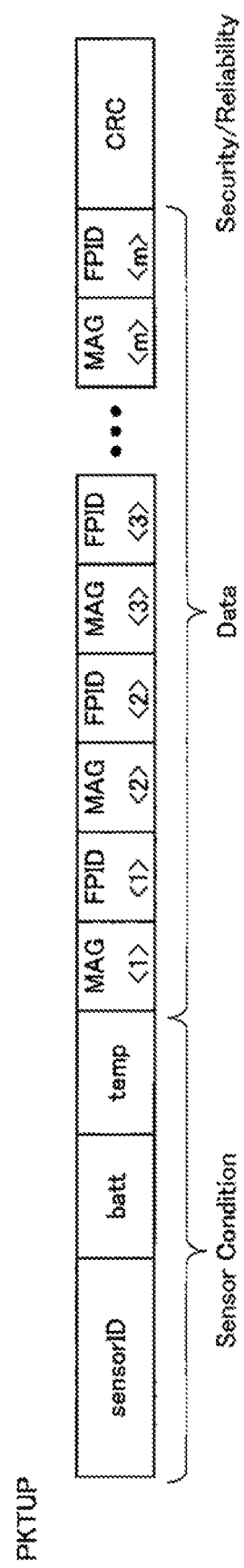

FIG. 21B illustrates an example of the configuration of the packet PKTUP of the communication payload which is transmitted by the communication circuit 1300 in the case of the orthogonal detection unit 1000' of the configuration illustrated in FIG. 20.

As illustrated in FIG. 21B, in the packet PKTUP, information (Sensor Condition) indicating a sensor condition, data (Data) such as the AC amplitude value MAG and the frequency control output FPID, and security/reliability guarantee information (CRC) are disposed.

Herein, in the data (Data) section, m AC amplitude values MAG and the frequency control output FPID are disposed.

Figure 22:
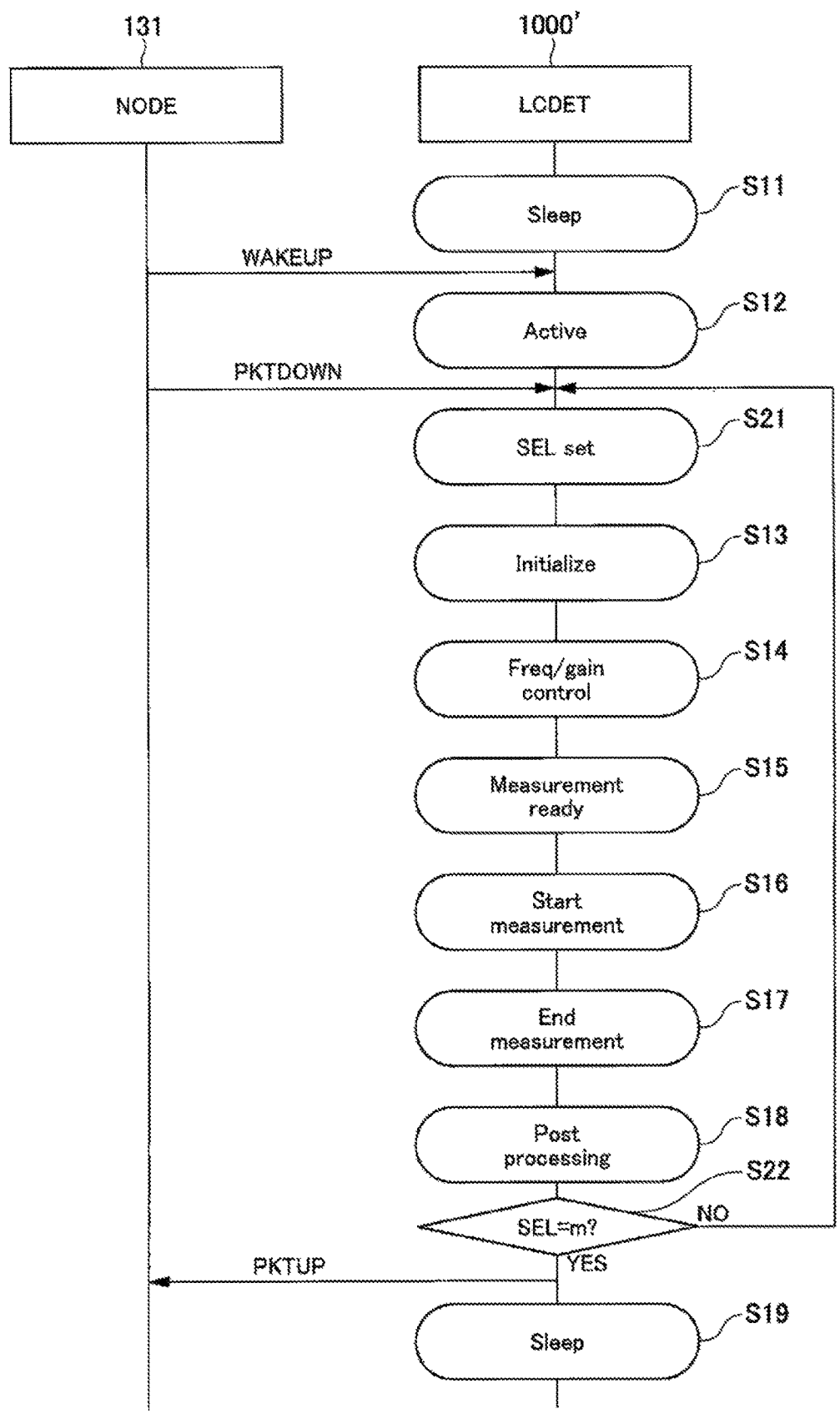
FIG. 22 is a sequence diagram at the time of activation of the detection unit in the case of the exemplary configuration illustrated in FIG. 20.

FIG. 22 illustrates an activation sequence of activating the orthogonal detection unit 1000' in a case where the orthogonal detection unit 1000' of the configuration illustrated in FIG. 20 is provided. In FIG. 22, the same processes as those of the activation sequence illustrated in FIG. 4 will be attached with the same step number.

The sequence illustrated in FIG. 22 is different from the sequence illustrated in FIG. 4 in that the process of Step S21 is performed between Step S12 and Step S13, and the determination process of Step S22 is performed between Step S18 and Step S19.

In other words, the orthogonal detection unit 1000 transitions to the active state in Step S12, and the select process is performed by the multiplexer 1801 on the basis of the select signal SEL in Step S21, and then the process proceeds to the initialization operation of Step S13.

In addition, after the measurement result data is transmitted by the uplink communication in Step S18, it is determined whether all m times of selection are performed in Step S22. In a case where m times of selection are performed (YES of Step S22), the process proceeds to standby of Step S19. In addition, in a case where all m times of selection are not performed in Step S22 (NO of Step S22), the next select signal SEL is sent to the multiplexer 1801, and the processes from Step S21 to Step S18 are repeatedly performed.

In this way, one orthogonal detection unit 1000' can detect the output signals of the plurality of current detectors 1502, and sequentially transmit the output signals to the cloud calculator 130. With the configuration illustrated in FIG. 20, a number of rotary machines 1500 can be efficiently detected by a smaller number of detection units, and the system configuration can be made simplified.

Further, in the configuration of FIG. 20 and the configuration illustrated in FIG. 1, the input circuit 1110 is provided as the analog front end 1100, the output CONDO of the input circuit 1110 is supplied to the analog-digital conversion circuit 1120 to obtain the digitalized output ADCO. With this regard, the output of the current detector 1502 may be directly supplied to the analog-digital conversion circuit 1120 to perform the digital conversion. For example, when the orthogonal detection unit is configured by a microcomputer (so-called micom), the output of the current detector 1502 may be configured to be supplied to an input MUX which is an input of the analog-digital conversion circuit 1120 of the microcomputer.

In addition, the configuration illustrated in FIG. 20 has been described to be combined to the configuration of the first embodiment illustrated in FIG. 1. However, similarly, the output signals of the plurality of current detectors 1502 may be detected by one detection unit in the second embodiment.

In addition, in a case where there is no need to remove noises depending on an actual operation state, some or all of the low-pass filters 1203 and 1204 of the detection unit and the band-pass filter 1208 may be omitted in the first embodiment and the second embodiment. In addition, even in a case where these filters are provided, the low-pass filter and the band-pass filter may be disposed at places other than the connection positions illustrated in FIG. 1.

In addition, the above embodiments have been described about the diagnostic system of the rotary machine (motor). With this regard, the invention can be applied not only to the degradation diagnosis of a motor but even also to the diagnosis of the rotary machine other than the motor where the sideband wave is generated near the main peak of the drive current due to degradation.

In addition, in the configurations and functions block diagrams, only control lines and information lines considered to be necessary for explanation are illustrated, but not all the control lines and the information lines for a product are illustrated. In practice, almost all the configurations may be considered to be connected to each other.

In addition, the configurations described in the embodiments may be realized in software such that a processor interprets and performs a program which realizes each function. The information of programs to realize the functions may be stored in a memory, a recording device such as a hard disk, an SSD (Solid State Drive), or a recording medium such as an IC card, an SD card, and an optical disk.

What is claimed is:

1. A rotary machine diagnostic system, comprising:
a current detector which detects a current of at least one current line connected to a rotary machine; and
a detection unit which extracts a magnitude of a sideband wave where an orthogonal detection is performed on a main frequency of the current detected by the current detector,
wherein the detection unit includes an analog front end circuit which includes an input filter,
wherein a cutoff frequency of the input filter is higher than at least the main frequency,
wherein the detection unit includes a band-pass filter which has a frequency of at least the sideband wave as a passing band, and
wherein the band-pass filter is applied to a result of the orthogonal detection.

2. The rotary machine diagnostic system according to claim 1, wherein
the detection unit includes a communication circuit, and
the extracted magnitude of the sideband wave is transmitted to a host system.

3. The rotary machine diagnostic system according to claim 1,
wherein the detection unit includes a power source circuit, and is driven by power supplied from a battery.

4. The rotary machine diagnostic system according to claim 1,
wherein the detection unit includes a power source circuit, and is driven by power obtained by an energy harvesting device or by power obtained by detecting the current of the current line.

5. The rotary machine diagnostic system according to claim 1,
wherein the magnitude of the sideband wave is extracted after an operation of the detection unit is statically determined.

6. The rotary machine diagnostic system according to claim 2, wherein
an operation setting value of the detection unit is received using the communication circuit, and
the detection unit is operated on the basis of the received operation setting value.

7. The rotary machine diagnostic system according to claim 2,
wherein a plurality of the current detectors and the detection units are prepared,
the system, comprising:
a data collecting device which collects data detected by the plurality of detection units; and
a cloud calculator which accumulates the data collected by the data collecting device.

8. The rotary machine diagnostic system according to claim 1, wherein
the detection unit includes a data latch which samples an input of the detection unit, and
the input of the detection unit is sampled by the data latch.

9. The rotary machine diagnostic system according to claim 1, wherein
the cutoff frequency of the input filter is lower than twice the main frequency.

* * * * *